(12) United States Patent
Mieher et al.

(10) Patent No.: US 7,382,447 B2
(45) Date of Patent: Jun. 3, 2008

(54) METHOD FOR DETERMINING LITHOGRAPHIC FOCUS AND EXPOSURE

(75) Inventors: Walter Mieher, Los Gatos, CA (US); Thaddeus G. Dziura, San Jose, CA (US); Ady Levy, Sunnyvale, CA (US); Chris A. Mack, Austin, TX (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 501 days.

(21) Appl. No.: 10/186,294

(22) Filed: Jun. 26, 2002

(65) Prior Publication Data

US 2003/0048458 A1   Mar. 13, 2003

Related U.S. Application Data

(60) Provisional application No. 60/391,290, filed on Jun. 24, 2002, provisional application No. 60/361,837, filed on Mar. 4, 2002, provisional application No. 60/301,270, filed on Jun. 26, 2001.

(51) Int. Cl.
*G01B 9/00* (2006.01)
*G01B 11/24* (2006.01)
*G01B 11/30* (2006.01)
*G03C 5/00* (2006.01)

(52) U.S. Cl. ............... 356/125; 356/124; 356/601; 430/30

(58) Field of Classification Search ............ 356/125, 356/400–401; 430/5, 22, 30; 355/53, 55
See application file for complete search history.

(56) References Cited

U.S. PATENT DOCUMENTS

| | | | |
|---|---|---|---|
| 4,039,370 A | 8/1977 | Kleinknecht | |
| 4,141,780 A | 2/1979 | Kleinknecht et al. | |
| 4,200,396 A | 4/1980 | Kleinknecht et al. | |
| 4,303,341 A | 12/1981 | Kleinknecht et al. | |
| 4,330,213 A | 5/1982 | Kleinknecht et al. | |
| 4,408,884 A | 10/1983 | Kleinknecht et al. | |
| 4,710,642 A | 12/1987 | McNeil | |
| 4,905,170 A | 2/1990 | Forouhi et al. | |
| 4,908,656 A | 3/1990 | Suwa et al. | |
| 5,164,790 A | 11/1992 | McNeil et al. | |
| 5,241,369 A | 8/1993 | McNeil et al. | |
| 5,329,357 A | 7/1994 | Bernoux et al. | |
| 5,381,233 A | 1/1995 | Chao et al. | |
| 5,416,594 A | 5/1995 | Gross et al. | |
| 5,607,800 A | 3/1997 | Ziger | |
| 5,608,526 A | 3/1997 | Piwonka-Corle et al. | |
| 5,629,772 A | 5/1997 | Ausschnitt | |
| 5,739,909 A | 4/1998 | Blayo et al. | |
| 5,757,671 A | 5/1998 | Drevillon et al. | |

(Continued)

OTHER PUBLICATIONS

Junwei Bao, "A Lithography Focus Monitor Based on Scattering from 2D Gratings", downloaded May 22, 2002, http://buffy.eecs.berkeley.edu/IRO/Summary/99abstracts/junwei.1.html.
Junwei Bao., "A Spectral Scatterometry-Based Pilot Inspector", downloaded May 22, 2002, http://buffy.eecs.berkeley.edu/IRO/Summary/98abstracts/junwei.3.html.
Edgar et al., "Simultaneous Identification of Focus and Exposure Drifts in Control of Photolithography CD", downloaded May 22, 2002, Technical Program paper Detail—AIChE.
Ralph Foong, "Characterizing the Sensitivity of Spectral Scatterometry", Downloaded May 30, 2002, http://buffy.eecs.berkeley.edu/IRO/Summary/00abstracts/foong.1.html.

(Continued)

*Primary Examiner*—Gregory J. Toatley, Jr.
*Assistant Examiner*—Gordon J. Stock, Jr.
(74) *Attorney, Agent, or Firm*—Weaver Austin; Villeneuve & Sampson LLP

(57) ABSTRACT

A method for determining one or more process parameter settings of a photolithographic system is disclosed.

18 Claims, 15 Drawing Sheets

U.S. PATENT DOCUMENTS

| | | | |
|---|---|---|---|
| 5,773,174 A * | 6/1998 | Koizumi et al. | 430/30 |
| 5,790,254 A | 8/1998 | Ausschnitt | |
| 5,835,221 A | 11/1998 | Lee et al. | |
| 5,867,276 A | 2/1999 | McNeil et al. | |
| 5,902,703 A | 5/1999 | Leroux et al. | |
| 5,923,423 A | 7/1999 | Sawatari et al. | |
| 5,936,738 A | 8/1999 | Liebmann et al. | |
| 5,956,148 A | 9/1999 | Celii | |
| 5,963,329 A | 10/1999 | Conrad et al. | |
| 5,965,309 A * | 10/1999 | Ausschnitt et al. | 430/30 |
| 6,031,615 A | 2/2000 | Meeks et al. | |
| 6,063,531 A | 5/2000 | Singh et al. | |
| 6,118,525 A | 9/2000 | Fossey et al. | |
| 6,304,999 B1 * | 10/2001 | Toprac et al. | 716/4 |
| 6,429,930 B1 * | 8/2002 | Littau et al. | 356/124 |
| 6,433,878 B1 * | 8/2002 | Niu et al. | 356/603 |
| 6,483,580 B1 | 11/2002 | Xu et al. | |
| 6,485,872 B1 * | 11/2002 | Rosenthal et al. | 430/30 |
| 6,501,534 B1 * | 12/2002 | Singh et al. | 355/55 |
| 6,513,151 B1 * | 1/2003 | Erhardt et al. | 716/21 |
| 6,602,727 B1 * | 8/2003 | Rangarajan et al. | 438/14 |
| 6,617,087 B1 * | 9/2003 | Rangarajan et al. | 430/30 |
| 6,778,275 B2 * | 8/2004 | Bowes | 356/400 |

OTHER PUBLICATIONS

Mieher et al., "Spectroscopic CD Metrology for Sub-100nm Lithography Process Control", Proceedings of SPIE vol. 4689 (2002).

Moers et al., "Application of the aberration ring test (ARTEMIS™) to Determine lens Quality and Predict its Lithographic Performance", Proceedings of SPIE vol. 4346 (2001).

Xinhui Niu, "Spectral Scatterometry for CD Control", http://buffy.eecs.berkeley.edu/IRO/Summary/98abstracts/xniu.2.html, downloaded May 14, 2002.

Niu et al., "Spectral Spectroscopic Scatterometry in DUV Lithography", no date.

Joseph C. Pellegrini et al., "Emerging Trends in Photolithography Analysis and Control", New Vision Systems, Inc., Cambridge, MA, no date.

Schoot et al., "Printing 130nm DRAM Isolation Pattern: Zernike Correlation and Tool Improvement", Proceedings of SPIE vol. 4346 (2001).

Verhaegen et al., "CD Control for Two-Dimensional Features in Future Technology Nodes", Proceedings of SPIE vol. 4346 (2001).

Yeung et al., "Inverse Obstacle Problem in Ellipsometric Scatterometry", Department of Manufacturing Engineering, Boston University, no date.

"Metrology for the Future", European Semiconductor, Aug. 2001.

"2.1 Some Fundamental Considerations", Downloaded May 22, 2002, www.iue.tuwien.ac.at/publications/PhD%20theses/Kirchauer/node.html.

"3.2.1 Focus Effects and Process Window", Downloaded May 22, 2002, www.iue.tuwien.ac.at/publications/PhD%20theses/Kirchauer/node41.html.

Office Action dated May 11, 1999, received in related U.S. Appl. No. 09/036,557.

Office Action dated Nov. 10, 1999, received in related U.S. Appl. No. 09/036,557.

Office Action dated Jun. 7, 2000, received in related U.S. Appl. No. 09/036,557.

Office Action dated Dec. 20, 2000, received in related U.S. Appl. No. 09/036,557.

"Ultraviolet-visible ellipsometry for process control during the etching of submicrometer features," N. Blayo et al., J. Opt. Soc. Am. A, vol. 12, No. 3, Mar. 1995, pp. 591-599.

"Optical dispersion relations for amorphous semiconductors and amorphous dielectrics," A.R. Forouhi, A.R. Forouhi et al., Physical Review B, vol. 34, No. 10, Nov. 15, 1986, pp. 7018-7026.

"Optical properties of crystalline semiconductors and dielectrics," A.R. Forouhi et al., Physical Review B, vol. 38, No. 3, Jul. 15, 1988, pp. 1865-1873.

"Optical characterization of amorphous and polycrystalline silicon films," E. Ibok et al., Solid State Technology, Aug. 1995.

"Convergence of the coupled-wave method for metallic lamellar diffraction gratings," L. Li et al., Journal of the Optical Society of America A, vol. 10, No. 6, Jun. 1993, pp. 1184-1188.

"Multilayer modal method for diffraction gratings of arbitrary profile, depth, and permittivity," L. Li, Journal of the Optical Society of America A, vol. 10, No. 12, Dec. 1993, pp. 2581-2591.

"A model analysis of lamellar diffraction gratings in a conical mountings," L. Li, Journal of Modern Optics, vol. 40, No. 4, 1993, pp. 553-573.

"Metrology of subwavelength photoresist gratings using optical scatterometry," C.J. Raymond et al., J. Vac. Sci. Technol. B, vol. 13, No. 4, Jul./Aug. 1995, pp. 1484-1495.

"Line size effects on ultraviolet reflectance spectra," D.H. Ziger et al., Opt. Eng., vol. No. 1, Jan. 1997, pp. 243-250.

"Scatterometry and the Simulation of Diffraction-Based Metrology," S. Sohail et al., Microlithography World, Jul./Aug./Sep. 1993, pp. 5-16.

"A broadband UV small spot spectroscopic ellipsometer," T.R. Corle, SPIE Microlithography, 1995, pp. 1-12.

"Rigorous coupled-wave analysis of planar-grating diffraction," M.G. Moharam et al., J. Opt. Soc. Am., vol. 71, No. 7, Jul. 1981, pp. 811-818.

"Stable implementation of the rigorous coupled-wave analysis for surface-relief gratings: enhanced transmittance matrix approach," M.G. Moharam et al., J. Opt. Soc. Am. A, vol. 12, No. 5, May 1995, pp. 1077-1086.

"Analysis and Applicatons of Optical Diffraction by Gratings," T.K. Gaylord et al., Proceedings of the IEEE, vol. 73, No. 5, May 1985, pp. 894-937.

* cited by examiner

METHOD FOR DETERMINING LITHOGRAPHIC FOCUS AND EXPOSURE

CROSS REFERENCE TO RELATED APPLICATIONS

This application claims the priority of the following U.S. patent applications Ser. Nos., which are hereby incorporated herein by reference:

Application No.: 60/301,270, filed on Jun. 26, 2001 and entitled "METHOD FOR DETERMINING LITHOGRAPHIC FOCUS";

Application No.: 60/361,837, filed on Mar. 4, 2002 and entitled "METHOD FOR DETERMINING LITHOGRAPHIC FOCUS USING MULTIPLE SCATTEROMETRY MEASURMENTS"; and Application No.: 60/391,290, filed on Jun. 24, 2002 and entitled "SPECTROSCOPIC CD METROLOGY FOR SUB-100 nm LITHOGRAPHY PROCESS CONTROL."

This application is also related to the following U.S. Patent Application, which is hereby incorporated herein by reference:

Application No.: 09/036,557, filed on Mar. 6, 1998 and entitled "METHOD AND APPARATUS OF SPECTROSCOPIC SCATTEROMETER FOR CD AND PROFILE MEASUREMENT OF PERIODIC STRUCTURES AND PROCESS MONITOR."

FIELD OF THE INVENTION

The present invention relates generally to photolithography methods and systems, and more specifically to improved techniques for determining focus and exposure settings of a photolithographic system.

BACKGROUND OF THE INVENTION

Photolithography or optical lithography systems used in the manufacture of integrated circuits have been around for some time. Such systems have proven extremely effective in the precise manufacturing and formation of very small details in the product. In most photolithography systems, a circuit image is written on a substrate by transferring a pattern via a light or radiation beam (e.g., UV or ultraviolet light). For example, the lithography system may include a light or radiation source that projects a circuit image through a reticle and onto a silicon wafer coated with photoresist, i.e., a material sensitive to irradiation. The exposed photoresist typically forms a pattern that after development masks the layers of the wafer during subsequent processing steps, as for example deposition and/or etching.

Two of the most important process parameters for controlling the photolithographic process are focus and exposure. Focus generally deals with clarity with which an optical subsystem of the lithography system renders an image and exposure generally deals with the amount or dosage of light (or radiation) that is used to form the pattern (such as the light produced by a light source of the lithography system). Both affect the circuit pattern in a non-trivial way. For example, changes in focus and exposure may cause changes in the resist profile, i.e., the shape of the circuit printed in the photoresist. The resist profile is often described by three parameters related to a trapezoidal approximation of the profile: the linewidth or critical dimension (CD), the sidewall angle and the height. If the resist profile changes are too great, then the final circuit may not run properly or it may not run at all. By way of example, linewidth is one factor that determines the speed and the timing across the circuit and thus changes thereto may cause one portion of the circuit to run faster or slower than another portion of the circuit (thereby reducing the selling price of the chip since the circuit is clocked to the slower portion). As should be appreciated, the quality of the resist profile is directly related to the quality of the etched or deposited features formed therethrough. In addition, changes to the resist profile may cause open or shorted circuits such that the circuit may need to be discarded or reworked.

Presently, the optimal focus and exposure settings of the lithography system are determined using a focus exposure matrix (FEM), i.e., by exposing a wafer with multiple combinations of focus and exposure, and then inspecting the resultant pattern for the best resist profiles—the resist profiles that more closely match the desired or optimal resist profiles. The inspection is generally performed by a CD scanning electron microscope (CD-SEM) that measures the CD of the resist profile. The focus-exposure matrix may be visualized using a Bossung Plot. The Bossung Plot generally plots CD vs. focus position for varying levels of exposure, i.e., the varying levels of exposure are plotted as contour lines with linewidth representing the Y axis and focus position representing the X axis of the graph. Alternatively, the Bossung Plot may plot exposure vs. focus for varying values of CD, i.e., the values of CD are plotted as contour lines with exposure representing the Y axis and focus position representing the X axis of the graph. Other resist profile parameters, for example, sidewall angle and height may also be visualized using Bossung Plots. These plots are generally harder to obtain since measuring these shapes is often a difficult endeavor. In most cases, the wafer has to be destroyed, i.e., cut through, so that these parameters can be measured. The process window of the system may be determined by plotting multiple resist profile parameters, as for example, linewidth, sidewall angle, and height in the same Bossung Plot. The process window is generally defined as the region of focus and exposure that keeps the final resist profile within prescribed specifications (e.g., process window typically includes the optimum focus and exposure).

Unfortunately, the method described above has several drawbacks. For one, the focus and exposure tests are performed periodically and thus the process may drift out of control between tests. An out of control process may lead to wafers that may need to be scrapped or reworked thus reducing yield and increasing costs. For example, these tests may be performed at 12 hr increments, 1 day increments, 1 week increments and the like. Another drawback is that the lithography system has to stop production in order to perform the tests. That is, the production run must be stopped so that a focus exposure matrix test wafer can be inserted into the system. As should be appreciated, stopping the production run reduces the throughput of the lithography system thereby increasing cycle time and cost.

Attempts to remedy these drawbacks have included using a CD-SEM to measure the CD of a pattern during a production run, and then keeping the CD within prescribed specifications using exposure dose as a manipulated variable to affect changes in CD. Although the focus may have a significant effect on CD, it is assumed in this method that focus is constant and therefore does not effect the CD. Unfortunately, however, the focus of the photolithographic system may (and often does) drift over time making the assumption of constant focus false. Accordingly, this method may not be very accurate since two variables (focus and exposure) may affect the CD rather than one. Furthermore, it should be noted that it is generally not possible to independently manipulate two variables simultaneously (e.g., both focus and exposure) due to the fact that a single measurement type, CD, is the only available test that may be routinely performed, i.e., CD-SEM is typically only capable of measuring CD (e.g., unless using tilted beam CD-SEM). Another method for monitoring focus is generically based on the phenomenon of line end shortening.

In view of the foregoing, improved techniques for determining focus and exposure settings of a photolithographic system are desired. In particular, techniques that allow the system quick feedback by measuring or monitoring production wafers or material so that process drifts may be substantially eliminated without having to stop production.

SUMMARY OF THE INVENTION

The invention relates, in one embodiment, to a method for determining process parameter settings of a photolithographic system. The method includes correlating the values of a first set of one or more shape parameters with the values of a first set of one or more process parameters to produce dependencies. The method also includes determining the values of a second set of one or more shape parameters associated with one or more structures. The method further includes determining the values of a second set of one or more process parameters associated with forming the one or more structures by comparing the second set of one or more shape parameters with the correlated dependencies.

The invention relates, in another embodiment, to a method for determining the optimal processing conditions for a lithographic system. The method includes measuring scatterometry measurement sites on a focus exposure matrix wafer using a scatterometry system. The method also includes interpreting the scatterometry measurements into shape parameter information associated with the scatterometry measurement sites. The method further includes determining focus exposure dependencies of shape parameters using the shape information.

The invention relates, in another embodiment, to a method of focus exposure monitoring of a lithographic system. The method includes measuring scatterometry measurement sites on a product or test wafer using a scatterometry system. The method also includes interpreting the scatterometry measurements into shape parameter information associated with the scatterometry measurement sites. The method further includes determining the focus and exposure values used to process the test or product wafer by matching the shape parameter information with focus exposure dependencies.

BRIEF DESCRIPTION OF THE DRAWINGS

The present invention is illustrated by way of example, and not by way of limitation.

DETAILED DESCRIPTION OF THE INVENTION

The invention generally pertains a method for determining focus and/or exposure settings of a photolithographic system (e.g., stepper or scanner). One aspect of the invention relates to determining focus and/or exposure simultaneously. Another aspect of the invention relates to using more than one shape parameter to solve for focus and exposure. Another aspect of the invention relates to using shape information derived from scatterometry to determine best focus and/or exposure. This is generally accomplished by measuring and analyzing focus-exposure matrix wafer (or wafers). In some cases, a single target type is used, and in other cases, multiple target types are used. Another aspect of the invention relates to using shape information derived from scatterometry to determine the stepper or scanner focus and/or exposure on nominally processed wafers. In some cases, this is accomplished with a single target type, and in other cases, this is accomplished with multiple target types.

Embodiments of the invention are discussed below with reference to FIGS. 1-17. However, those skilled in the art will readily appreciate that the detailed description given herein with respect to these figures is for explanatory purposes as the invention extends beyond these limited embodiments.

Figure 1:
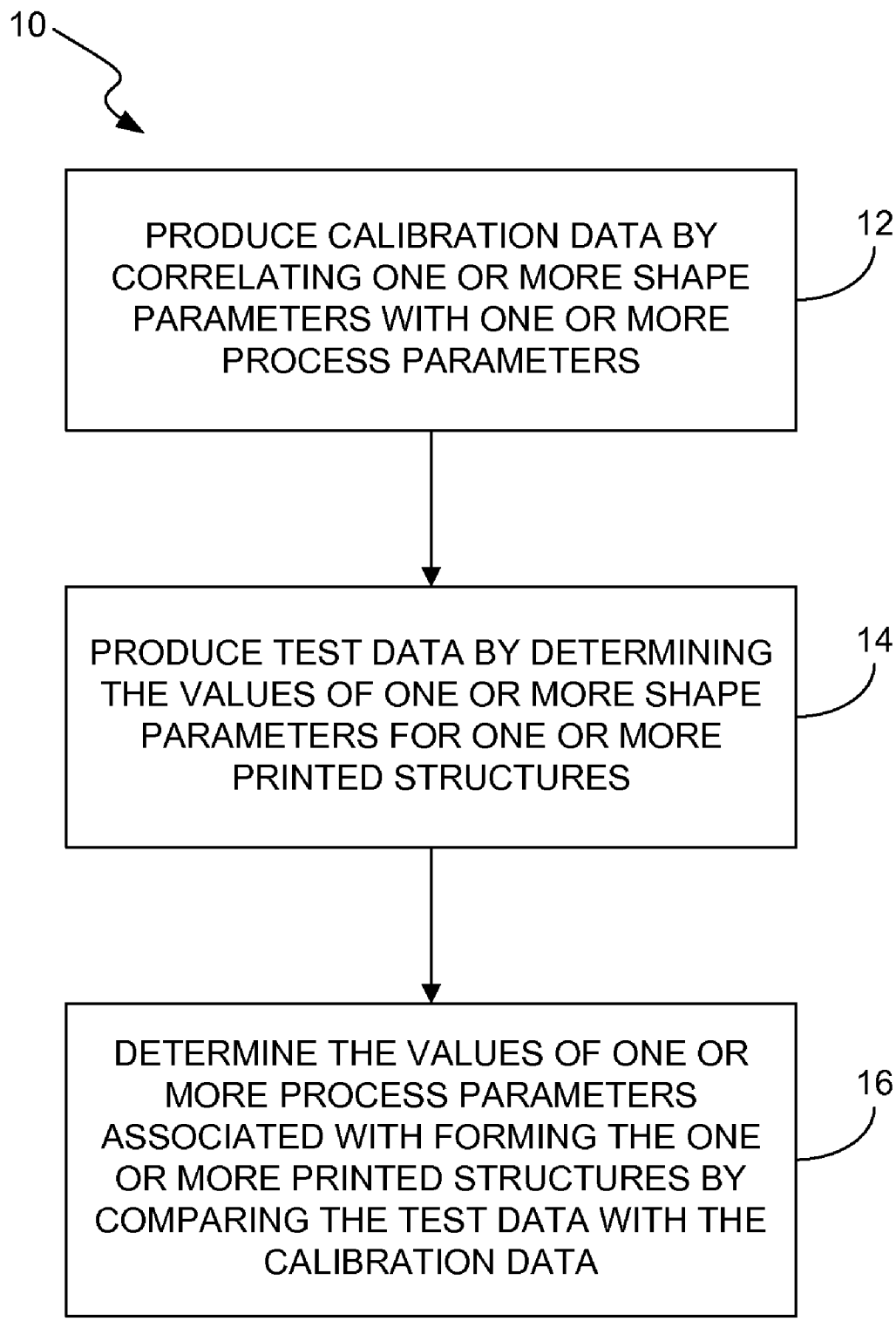
FIG. 1 is a flow diagram of process parameter estimating, in accordance with one embodiment of the present invention.

FIG. 1 is a flow diagram of process parameter estimating 10, in accordance with one embodiment of the present invention. Process parameter estimating 10 is generally configured to estimate or predict process parameter settings, which were used to form a pattern on a substrate during a lithographic process (e.g., photolithographic). Process parameters generally refer to parameters used to control the processing conditions of the lithography system. Process parameters generally effect the pattern in a non-trivial way. By way of example, process parameters may correspond to focus offset, exposure dose, resist thickness, develop time and temperature, post exposure bake time and temperature and the like. The estimated settings of the process parameters in process parameter estimating 10 may be used to improve the control of subsequent lithographic patterning and to determine whether the quality of the photolithographic pattern meets specified requirements. Process parameter estimating 10 may be suitable for a wide variety of photolithography processes, as for example, photolithographic processes pertaining to semiconductor manufacturing, optical device manufacturing, micro-mechanical device manufacturing, magnetic recording data storage manufacturing and the like. Although process parameter estimating 10 may be used in any of the above processes, the invention described herein is directed at semiconductor manufacturing for ease of discussion.

Process parameter estimating 10 generally begins at block 12 where calibration data is produced by correlating one or more shape parameters with one or more process parameters. The shape parameters are generally associated with the shape of a structure disposed on a wafer (e.g., a target structure or some portion of a device structure). The structure may be in the form of a grating that is typically periodic. The grating may be periodic in one direction (X or Y), as for example a line space grating, or it may be periodic in two directions (X and Y), as for example a grid space grating. The shape parameters may include line width (width at a specific height), side wall angle, height, pitch, top-profile (degree of top rounding or T topping), bottom profile (footing) and the like. The shape parameters may also include 3 dimensional shape information of structures that are periodic in both X and Y directions (as in grid space gratings). The lithography process parameters, on the other hand, are generally associated with the stepper or scanner parameters used to form the structure on the wafer. By way of example, the process parameters may correspond to focus, exposure and the like.

By correlating, it is generally meant that a relationship is made between the one or more shape parameters and the one or more process parameters. The relationship may be in the form of dependencies. As should be appreciated, the shape parameters are typically dependent on the process parameters used to form them and thus changes in the process parameters generally cause changes in the shape parameters. For example, changes in focus may cause changes in line width. The changes may be characterized over a wide range of values thereby forming dependencies that describe the impact of these parameters on each other (e.g., variables or numbers that are contingent on other variables). The dependencies may be widely varied. However, in most cases, the dependencies are often described using equations or graphical plots, as for example Bossung Plots (see FIGS. 7-12).

In one embodiment, the dependencies include one or more shape parameters as a function of one or more process parameters (e.g., process parameters are dependent on shape parameters). For example, the dependencies may include a single shape parameter as a function of a single process parameter (e.g., width as a function of focus), a single shape parameter as a function of more than one process parameter (e.g., height as a function of focus and exposure), a plurality of shape parameters as a function of a single process parameter (e.g., height and width as a function of focus) or a plurality of shape parameters as a function of a plurality of process parameter (e.g., height as a function of focus and exposure, wall angle as a function of focus and exposure and width as a function of focus and exposure). In one particular implementation, the dependencies include more than one shape parameter as a function of both focus and exposure. For example, line width as a function of focus and exposure (e.g., CDf(F,E)), height as a function of focus and exposure (e.g., Htf (F,E)) and wall angle as a function of focus and exposure (e.g., SWAf(F,E)). It should be noted that these examples are not a limitation and that the dependencies may vary according to the specific needs of the system. For example, other shape parameters may be used.

In another embodiment, the dependencies include one or more process parameters as a function of one or more shape parameters. For example, the dependencies may include a single process parameter as a function of a single shape parameter (e.g., focus as a function of width), a single process parameter as a function of more than one shape parameter (e.g., focus as a function of width and height), a plurality of process parameters as a function of a single process parameter (e.g., focus and exposure as a function of wall angle) or a plurality of process parameters as a function of a plurality of shape parameter (e.g., focus as a function of width and height, and exposure as a function of wall angle and width). These dependencies may be produced by deriving one or more shape parameters as a function of one or more process parameters (as discussed above), and then converting these functions to form one or more process parameters as a function of one or more shape parameters. This may generally be accomplished by performing a matrix inversion with the previous functions. In one particular implementation, the dependencies include focus and exposure as a function of more than one shape parameter. For example, focus as a function of height and line width (e.g., Ff(Ht, CD)), and exposure as a function of height and line width (e.g., Eg(Ht, CD)). With regards to Bossung Plots, inversions may change the graphs so that instead of having curves of constant exposure, the graphs have curves of constant shape parameters (e.g., line width). It should be noted that these examples are not a limitation and that the dependencies may vary according to the specific needs of the system. For example, other shape parameters may be used.

The calibration data (e.g., dependencies) may be produced using a variety of techniques. For example, the calibration data may be produced using lithographic simulation methods or lithographic measurement methods. Lithographic simulation methods generally produce calibration data by performing calculations to obtain the predicted profile as a function of lithographic process parameters. The theoretical profiles may then be translated into shape parameters that approximate the profile. Thus the dependencies of the shape parameters on the process parameters may be obtained. In most cases, the lithography and resist processing simulations are calibrated such that the calculated profile accurately corresponds to the measured profile obtained on a real wafer. One example of a lithography simulation program that can be used to calculate the resist profiles for varying lithography parameters and resist process conditions is PROLITH manufactured by KLA-Tencor of San Jose, Calif.

The lithographic measurement methods, on the other hand, generally produce calibration data by printing a plurality of structures on one or more test wafers using various process parameters, determining the shape parameters associated with each of the structures, and correlating the shape parameters with the various process parameters (so as to form dependencies). As already mentioned, the shape parameters are typically dependent on the process parameters and thus changes in the process parameters generally cause changes in the shape parameters. For instance, a first process parameter value may produce a first shape parameter value and a second process parameter value may produce a second shape parameter value (multiple data points at multiple levels). These changes may be characterized over a wide range of values thereby forming equations or graphical plots that describe the impact of these parameters on each other.

To elaborate, printing is generally accomplished in a layer of photoresist by projecting light or radiation through a pattern of a test reticle. The structures are normally printed across the entire test wafer using a different combination of process parameters (test matrix). That is, each structure may be printed with different process parameter levels For example, the structures may be printed with varying levels of exposure and focus—for different exposure fields across the wafer, vary focus in one direction and exposure in the other direction so as to produce a matrix of different values of exposure and focus across the wafer (e.g., focus-exposure test matrix). When using multiple test wafers, the same or different test reticles may be used. The different test reticles may have patterns with different dimensions so as to produce a wider range of test data. As should be appreciated, different dimensions may produce different structures and thus different shape parameters for the same processing conditions. The pattern configuration may be widely varied. For example, the pattern configuration may be configured to produce a grating structure. The method of determining the shape parameters may also be widely varied. For example, the shape parameters of the printed structures may be determined using CD-SEM, scatterometry and other related techniques. Scatterometry is generally preferred since scatterometry can be used to determine multiple shape parameters at the same time. For example, scatterometry measurements may contain information about linewidth (CD), height, side wall angle and the like (CD-SEM typically only measures CD). Scatterometry techniques will be described in greater detail below.

In one embodiment, the dependencies produced in block 12 are used to determine the best process parameter settings for driving the process. In essence, they help to determine the process parameters, which will be programmed into the lithography system at the start of a production run. By way of example, the best process parameters may be determined using overlapping Bossung Plots (see FIGS. 10-12). Overlapping plots typically reduces errors found in each individual graph and it may overcome the problems with multiple solutions for a particular process parameter, i.e., even if exposure is known, there are typically two solutions for focus (that will produce the same line width defined at a given height). For example, Exposure vs. Focus plots having two sets of overlapping contour lines, each set representing a different shape parameter, may be used. These curves describe all the possible solutions for focus and exposure for a given set of shape parameters. As should be appreciated, the points where the different contour lines intersect represent points of best focus and exposure. The best exposure and focus may be determined by following the contour lines representing the desired values of the shape parameters (e.g., line width=120 nm, height=280 nm). The best exposure and focus may also be determined using an error minimization method for a wider range of desired values of shape parameters (e.g., all values within 5% of the desired value).

Following block 12, the process flow proceeds to block 14 where test data is produced by determining the values of one or more shape parameters associated with one or more printed structures. The term printed structures generally refers to structures that are printed on a wafer (e.g., a target structure or some portion of a device structure). The printed structures may be printed in a variety of different wafer layers. In most cases, however, the printed structures are printed in a layer of photoresist using standard photolithograghic processes (e.g., projecting a circuit image through a reticle and onto a silicon wafer coated with photoresist). The wafer may be a test wafer with layers of materials that correspond to the materials typically present on product wafers at that step in the test process. The wafer may be a product wafer that has the potential to produce working devices. The wafer may be a simple test wafer used for testing the lithography system. The process parameters used to form the printed structures are generally configured to keep the shape parameters within desired specifications. The printed structures may be printed on a test wafer as a part of a test procedure or they may be printed on a production wafer during production. In production, the printed structures are typically printed in the scribeline between device structures (e.g., dies that define the IC) disposed on a production wafer. During tests, the printed structures may be printed across the entire test wafer.

The printed structures may be widely varied (e.g., the printed structures generally vary according to the methods used to determine the values of one or more shape parameters). For example, the printed structures may take the form of a grating structure, as for example a line space grating or a grid space grating. Similar to above, the shape parameters may include line width (width at a specific height), side wall angle, height, pitch, top-profile (degree of top rounding or T topping), bottom profile (footing) and the like. The number of printed structures may also be widely varied. When using multiple printed structures, each may have the same or different patterns.

In most cases, the shape parameters that are determined in block 14 correspond to the same shape parameters that were calibrated in block 12. For example, if line width and height were calibrated in block 12, then line width and height are determined in block 14. It should be noted, however, that this is not a limitation and that more parameters may be calibrated in the calibration mode than determined in the test mode. For example, a large database or library of a large number of shape parameters as a function of one or more process parameters may be obtained in the calibration mode, while only a small number of the shape parameters may be determined in the test mode.

The test data may be produced using a variety of techniques. In most cases, the test data is produced by measuring the printed structures with a measurement system and converting the measurements into shape parameter values. Any suitable measurement technique may be used so long as the measurements obtained are capable of being converted into shape information, i.e., the raw measured data is converted into shape data. By way of example, CD-SEM, scatterometry, atomic force microscopy, cross sectional SEM techniques and the like may be used. In a preferred embodiment, the shape parameters of the printed structures are measured via scatterometry since scatterometry is capable of measuring multiple shape parameters such as line width, wall angle and height (CD-SEM typically only measures line width) at the same time. Furthermore, scatterometry may be used in-line on production wafers thus eliminating the need to stop production. That is, metrology tools based on scatterometry may be used to perform focus and/or exposure monitoring on product wafers to enable ongoing focus/exposure process control and to reduce the requirement for time-consuming FEM test wafers.

Scatterometry is a measurement technique that is capable of characterizing multiple shape parameters of a pattern. The pattern is typically in the form of grating structure such as a periodic grating structure. In scatterometry, one or more light or radiation beams are made incident on the grating structure and the scattered, reflected and/or diffracted beams emanating from the grating structure are measured. The incident light may be directed toward the pattern normally or at some angle to the normal. The light emanating from the grating structure is typically scattered, reflected and/or diffracted at various orders, i.e., angles relative to the incident light. The characteristics of the scattered, reflected and/or diffracted light (e.g., intensity, phase, polarization, and the like) at the various orders is measured thereby forming a measurement signal or measured spectra. The characteristics of the scattered, reflected and/or diffracted light generally reveal information about the shape of the grating structure. That is, the scattered, reflected and/or diffracted light typically changes in accordance with the shape of the structures and thus the scattered, reflected and/or diffracted light may be used to determine the shape parameters of the structures, i.e., there is a unique relationship between the measured spectra and the profile of the grating structure.

The shape parameters are generally extracted from the measured spectra by comparing the measured spectra to a library containing up to hundreds of thousands of spectra that has been calibrated to hundreds of thousands of profiles. The objective is to find a profile whose calibrated spectra matches the measured spectra. Each profile is defined by shape parameters and thus the shape parameters are known once the profile is found. The library may be produced using actual measurements (calculated reference spectra) or simulation techniques (simulated reference spectra).

Changing to shape information rather than leaving as data in the form of spectra has several advantages. For one, when scatterometry spectra are analyzed to produce shape information, other process variations (such as thickness variation in underlying layers) are separated from the lithography process information. Such process variation is common in production wafers. In contrast, direct use of spectra works best on well controlled test wafers where there is little variation of the material thickness and properties and little corresponding contribution to variation in the spectra.

Although, the method described herein does not directly compare spectra (e.g., it compares shape information rather than spectra), it should be noted that this is not a limitation and that the spectra may be compared.

The scatterometry technique used to measure the grating structure (e.g., periodic) may be widely varied. For example, reflectometry, spectroscopic ellipsometry, multiwavelength reflectometry, polarized spectroscopic reflectometry, multi-angle multiwavelength reflectometry or angle resolved scatterometry may be used. Further, the measurement may be performed in a fixed angle spectroscopic ellipsometry mode, in an angle scanning single or multiple wavelength mode, or in a multiple angle multiple wavelength mode. That is, the beam(s) may be brought in at a single or multiple angles and they may be brought in at a single wavelength or at multiple wavelengths. In addition, the beams may be detected at a single angle or multiple angles and they may be detected at single or multiple wavelengths. Furthermore, the intensity, polarization and/or optical phase of the beams may be measured at different angles and/or different wavelengths.

With regards to scatterometry, some people in the art believe that the wavelength range containing useful shape information is limited to a maximum wavelength of about 65 percent of the size of the feature in interest. It should be noted, however, that the shape information may also be contained in wavelengths larger than 65 percent of the feature in interest. Therefore, in one embodiment, wavelengths of greater than 65 percent of the feature size in interest are used during scatterometry measurements. In another embodiment, wavelengths that are equal to the feature size in interest are used during scatterometry measurements. In another embodiment, wavelengths that are greater than the feature size in interest are used during scatterometry measurements (wavelength that are greater than feature size are generally easier to implement than if they are smaller than the feature size). In one particular embodiment, the wavelengths are 250-750 nm for feature sizes of 50-250 nm. It should be noted, however, that this is not a limitation and that the wavelengths and feature sizes may vary according to the specific needs of each device.

By way of example, scatterometry techniques that may be used are described in greater detail in a pending U.S. patent application Ser. No. 09/036,557, titled "METHOD AND APPARATUS OF SPECTROSCOPIC SCATTEROMETER FOR CD AND PROFILE MEASUREMENT OF PERIODIC STRUCTURES AND PROCESS MONITOR," filed on Mar. 6, 1998, and which is herein incorporated by reference.

Scatterometry measurements (e.g., block 12 or block 14) may be performed using SpectraCD ™ manufactured by KLA-Tencor of San Jose, CA. The SpectraCD or equivalents thereof may be integrated with a lithography cell to obtain information on the process that can enable better process control and higher device profit margin than is possible with currently available metrology. Determining optimum focus/exposure settings from analysis of scatterometry measurements on focus/exposure test wafers may be implemented with ProData ™ and Process Window Monitoring (PWM™) lithography process analysis systems manufactured by KLA-Tencor of San Jose, Calif. Extracting profile information from measured scatterometry spectra may be performed by comparing the measured scatterometry spectra with libraries generated with SpectraLG™ library generation system manufactured by KLA-Tencor of San Jose, Calif. These and other details of scatterometry are described in greater detail in "Spectroscopic CD Metrology for Sub-100 nm Lithography Process Control" to Mieher et al., which is herein incorporated by reference.

Following block 14, the process flow proceeds to block 16 where the values of one or more process parameters associated with forming the printed structures are determined by comparing the test data with the calibration data. In the simplest terms, the determined values of the shape parameters in block 14 are compared with the calibrated values of the shape parameters in block 12 so as to determine the values of the process parameters for the determined values. That is, the shape parameter values of block 14 are matched to similar shape parameter values of block 12 and the corresponding process parameters that produced those shape parameters in block 12 are chosen as the process parameters that formed the shape parameters in block 14. In more complex terms, conversion calculations or graphical comparisons using the functions obtained in the calibration mode and the measurements obtained in the test mode are performed.

In one implementation, for example, the process parameters used in block 14 may be determined by plugging the values of the shape parameters determined in block 14 into an equation representative of the functions determined in block 12. For example, the determined values of line width and height of the measured grating structure may be inserted into the function Ff(CD,Ht) to produce a "measured" focus value representative of the actual focus value used to produce the grating structure. Alternatively or additionally, the determined values of line width and height of the measured grating structure may be inserted into the function Ef(CD, Ht) to produce a "measured" exposure value representative of the actual exposure value used to produce the grating structure. In another implementation, the process parameters used in block 14 may be determined by referring to graphical plots representative of the functions. For example, overlapping Bossung Plots may show the value of the process parameter(s) at the intersection of the line contours corresponding to the shape parameter(s) value determined in block 14. That is, the point of intersection between CD and Ht at the determined values may show the values of focus and/or exposure, i.e., the curves will cross at one height and one CD thus yielding one answer for focus and exposure. Additionally or alternatively, the measured focus and exposure could be arrived at by interpolating between neighboring intersections of the different contours (e.g., CD and Ht contours).

Although the method described herein (with regards to using scatterometry) does not directly compare spectra (e.g., it compares shape information rather than spectra), it should be noted that this is not a limitation and that the spectra may be compared. Using shape information, however, is generally preferred since it has several advantages over using spectra. For example, when scatterometry spectra are analyzed to produce shape information, other process variations (such as thickness variation in underlying layers) are separated from the lithography process information. Such process variation is common in production wafers. In contrast, direct use of spectra works best on well controlled test wafers where there is little variation of the material thickness and properties and little corresponding contribution to variation in the spectra.

After block 16, post estimating steps may be performed. For example, the estimated or predicted values of the process parameters determined in block 16 may be used to control subsequent processing to keep the process within desired limits. In one embodiment, the determined values of the process parameters in block 16 are compared with the optimal values found in block 12 to produce a process parameter correction. The correction may be used to help control the lithographic process (by adjusting the process parameters). These corrections may be produced in a die to die mode, a wafer to wafer mode, other feed back control system and the like.

In accordance with one embodiment of the invention, the method described above is used to determine the focus and exposure settings of a photolithographic system (e.g., stepper or scanner). The general concept of this embodiment is to (1) determine the focus-exposure dependence of one or more shape parameters (e.g., line width, sidewall angle, height), (2) determine the numerical value of one or more of these shape parameters for a structure printed on a test or production wafer, and (3) compare the determined numerical value of the shape parameters to the previously determined focus-exposure dependence to determine the focus and/or exposure conditions that were used to pattern the structure printed on the wafer. With regards to the first element (1), the focus exposure dependencies of shape parameters of the shape parameters may be determined empirically by measurements (e.g., scatterometry) obtained from a focus exposure matrix and/or from modeled focus-exposure processes using simulation software (such as PROLITH manufactured by KLA-Tencor of San Jose, Calif.). With regards to the first and second elements (1) (2), the dependencies, as well as the numerical value of one or more of these shape parameters for a structure disposed on a wafer may be determined using scatterometry techniques.

The method may be used to monitor the focus and exposure of production wafers processed nominally at standard focus and exposure settings. The method may also be used to monitor focus and exposure of production wafers processed with the majority of the fields processed nominally at a standard focus and exposure setting with a minority of focus indicator fields processed at predetermined focus offsets.

In accordance with another embodiment of the invention, the method described above is configured to simultaneously solve for multiple process parameters using multiple shape parameters. This is generally accomplished in block 16 using a plurality of dependencies determined in block 12 and a plurality of shape parameters determined in block 14. As should be appreciated, determining a plurality of shape parameters in block 14 provides more than one input and may allow for a solution for more than one process parameter, i.e., in order to solve for more than one process variable, it is generally necessary to have more than one data input. The number of shape parameters is generally greater than or equal to the number or process parameters. In some cases, the method is configured to simultaneously solve for first and second process parameters using first and second shape parameters (e.g., solving for two unknowns variables using two known inputs). This generally provides a unique solution for the first and second process parameters. In other cases, the method is configured to simultaneously solve for first and second process parameters using more than two shape parameters, as for example first, second and third shape parameters. In the case of more than two shape parameters an optimal solution may be calculated. When using three equations and two unknowns, the likely hood that the solution is perfect is low. Least squares minimization is one possible error minimization method that may be used to calculate the optimal solution. Weighting factors may be assigned to the different shape parameters to calculate the optimal solution. The weighting factors may include the sensitivity of the process parameter to the shape parameter, the uncertainty of the shape parameter, and the like.

Simultaneous solutions using multiple shape parameters generally overcome problems associated with process parameter dependencies on shape parameters that allow multiple solutions of the process parameters for a given shape parameter value. For example, in the case of line width, the focus exposure dependence is non linear in focus and allows for multiple solutions for focus, even if the exposure dose is known accurately. Simultaneous solutions also remove the degeneracy between solutions that may be encountered when solving for focus and/or exposure with information from only one parameter (different shape parameters may have different dependences on focus and exposure). Using calibration curves determined from many focus exposure matrix measurements averages out measurement errors, stepper errors, and the like.

Figure 10A:
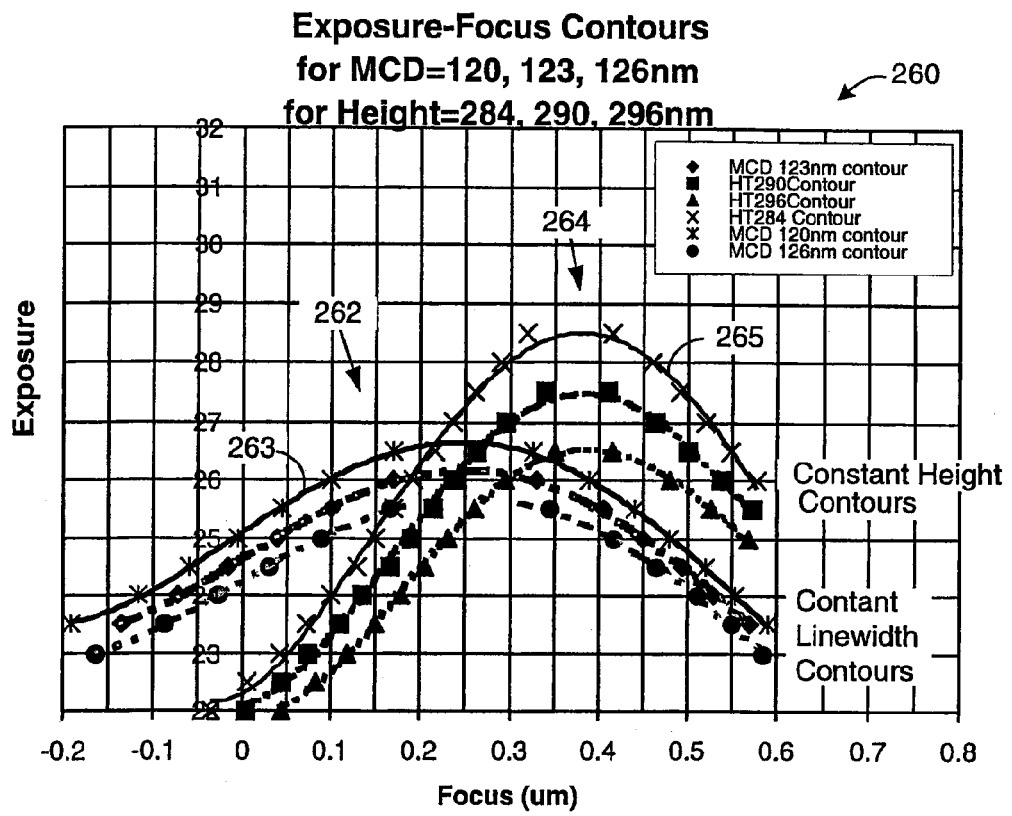
FIGS. 10a and 10b are overlapped Bossung Plots, in accordance with another embodiment of the invention.
Figure 10B:
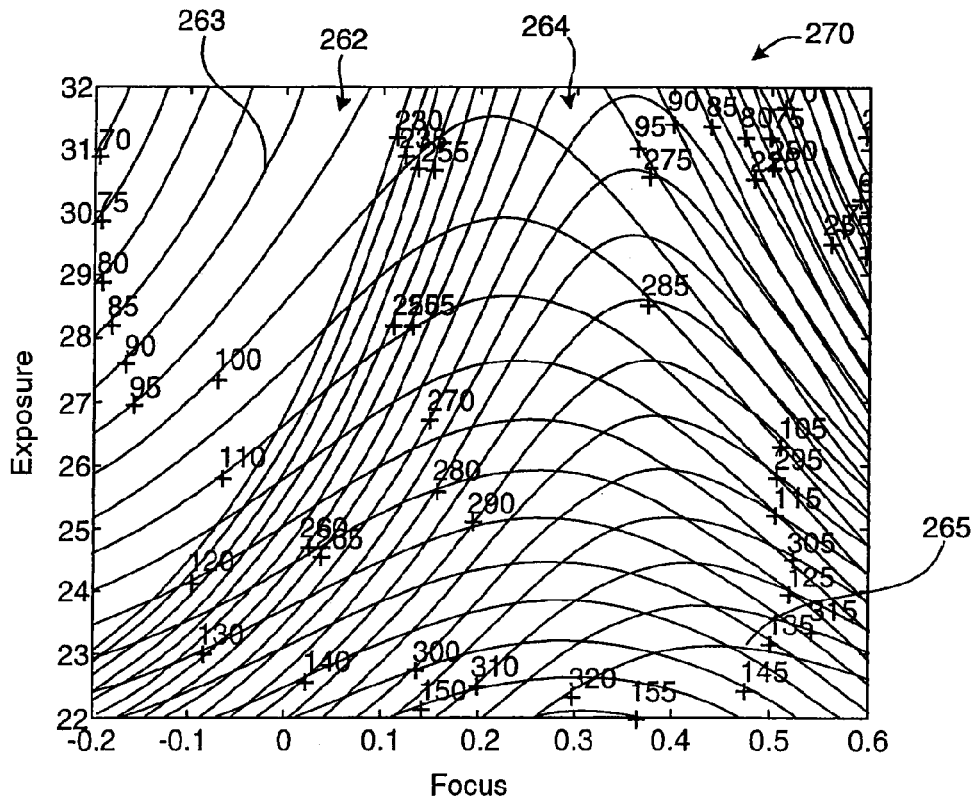

In one particular implementation of this embodiment, the method is configured to simultaneously solve for focus and exposure using multiple focus-exposure dependencies of multiple shape parameters. The basic idea is that in order to solve for two unknowns, Focus and Exposure, you need to have 2 or more equations and two or more pieces of information. For a single measurement site, the different pieces of information can be different, substantially orthogonal shape parameters like CD, HT or SWA. For example, simultaneously solving for linewidth and sidewall angle, or simultaneously solving for linewidth, sidewall angle and height. In one embodiment, the unique solutions are visualized using Bossung plots. For example, the unique solutions may be demonstrated by the intersections of curves of constant line width and curves of constant line height at only one point of focus and exposure as shown in FIGS. 10A and 10B. This implementation will be described in greater detail below. In another embodiment, the unique solutions are characterized by equations. Examples of equations modeled after the above mentioned method will now be described:

Sum Square Error=$[SP_1(PP_1,PP_2)-SP_{1\ measured}]^2+$
$[SP_2(PP_1, PP_2)-SP_{2\ measured}]$, where $SP_1(PP_1,PP_2)$ is a first shape parameter $SP_1$ as a function of first and second process parameters $PP_1$ and $PP_2$ as determined in the calibration mode, $SP_{1\ measured}$ is the first shape parameter measured in the test mode, $SP_2(PP_1,PP_2)$ is a second shape parameter $SP_2$ as a function of first and second process parameters $PP_1$ and $PP_2$, and $SP_{2\ measured}$ is the second shape parameter measured in the test mode.

Using this equation various values of the first and second process parameters are supplied to the functions until a minimum error is produced (e.g., closest to zero). The values that produce the minimum error correspond to the values $PP_{1\ measured}$ and $PP_{2\ measured}$, where $PP_{1\ measured}$ is equal to the value of the first process parameter that produced the printed pattern and $PP_{2\ measured}$ is equal to the value of the second process parameter that produced the printed pattern. By way of example, the shape parameters may correspond to linewidths (CD), line height, wall angle, and the like, and the process parameters may correspond to focus, exposure and the like.

In addition, a matrix inversion calculation may be performed using the functions obtained in the calibration mode. The matrix inversion calculation generally inverts the functions obtained in calibration mode so as to produce different functions. For example, the shape parameters as a function of process parameters may be inverted to produce process parameters as a function of shape parameters. A simplified example of a matrix inversion is shown below:

$SP_1(PP_1,PP_2)$
$SP_2(PP_1,PP_2)$ $\Rightarrow$ $PP_1(SP_1,SP_2,SP_3)$
$SP_3(PP_1,PP_2)$ $PP_2(SP_1,SP_2,SP_3)$ where
$SP_1$=a first shape parameter
$SP_2$=a second shape parameter
$SP_3$=a third shape parameter
$PP_1$=a first process parameter
$PP_2$=a second parameter.

Using the inverted equations the measured shape parameters $SP_{1\ measured}$, $SP_{2\ measured}$, $SP_{3\ measured}$ of the printed pattern obtained in the test mode are supplied to the inverted functions to produce $PP_{1\ measured}$ and $PP_{2\ measured}$, where $PP_{1\ measured}$ is equal to the value of the first process parameter that produced the printed pattern and $PP_{2\ measured}$ is equal to the value of the second process parameter that produced the printed pattern. By way of example, the shape parameters may correspond to linewidths (CD), line height, wall angle, pitch and the like, and the process parameters may correspond to focus, exposure and the like.

After determining $PP_{1\ measured}$ and $PP_{2\ measured}$, $PP_{1measured}$ and $PP_{2\ measured}$ may be compared to $PP_{1\ optimal}$ and $PP_{2\ optimal}$ to form corrections for adjusting the process parameters to keep the shape parameters within desired specifications. The optimal values are typically determined in block 12. By way of example, a simplified comparison equation is shown below:

$PP_{1\ optimal}-PP_{1\ measured}=\Delta PP_{1\ correction}$ $PP_{2\ optimal}-PP_{2\ measured}=\Delta PP_{2\ correction}$ In an alternate embodiment, the measured values of the shape parameters may be compared to the optimal values of the shape parameters. The difference between these two values may be used along with the inverted equation mentioned above to form corrections for the respective process parameters.

Figure 2:
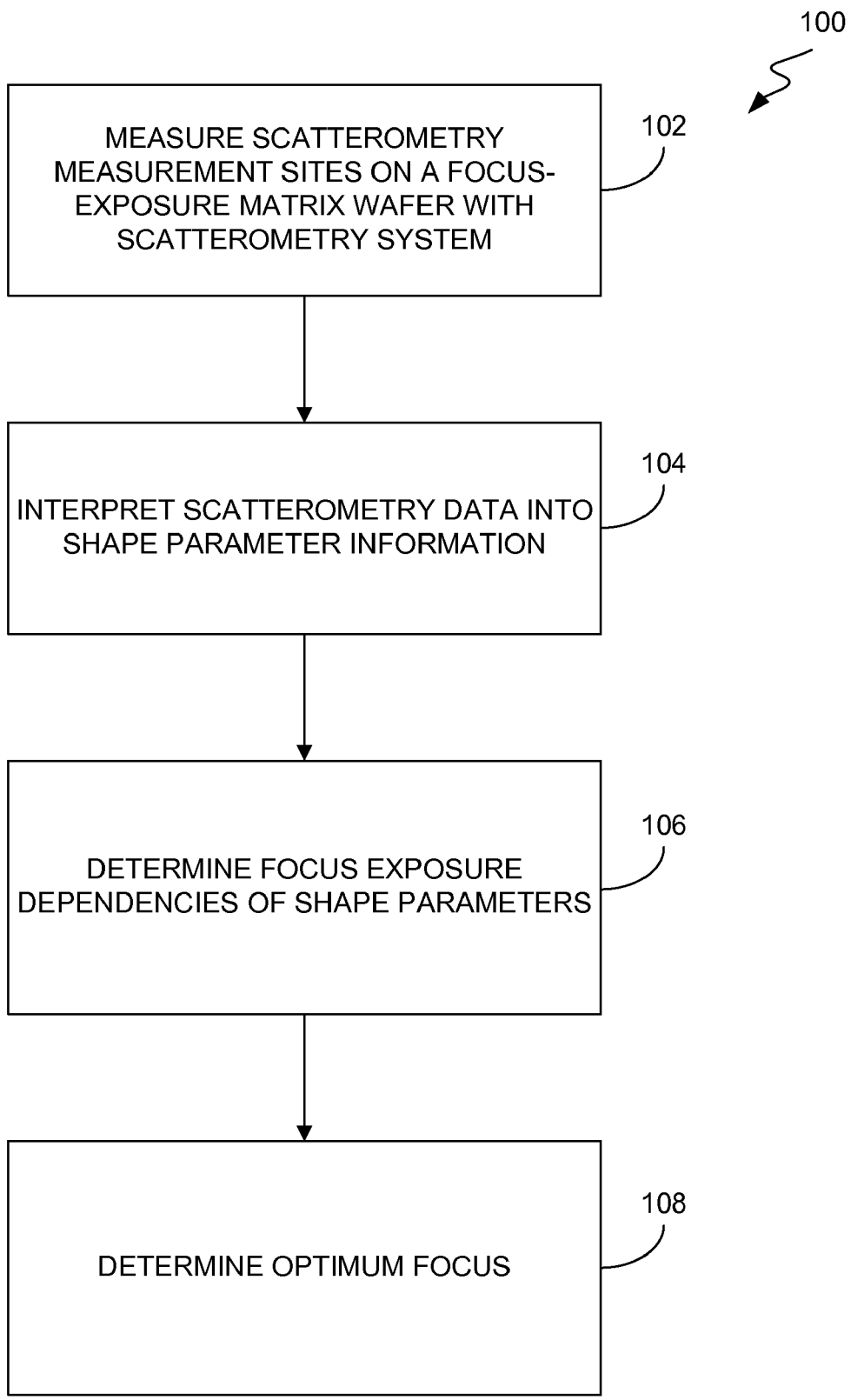
FIG. 2 is a method for determining optimal processing conditions, in accordance with one embodiment of the present invention.

$(SP_1, SP_2, SP_3)_{optimal}-(SP_1, SP_2, SP_3)_{measured}=\Delta(SP_1, SP_2, SP_3)_{correction}$ $PP_1(SP_1, SP_2, SP_3)_{correction}=\Delta PP_{1\ correction}$ $PP_2(SP_1, SP_2, SP_3)_{correction}=\Delta PP_{2\ correction}$ FIG. 2 is a method for determining optimal processing conditions 100, in accordance with one embodiment of the present invention. The method generally begins at block 102 where scatterometry measurement sites on a focus exposure matrix wafer (or wafers) are measured with a scatterometry system. The scatterometry measurement sites are typically printed in a layer of photoresist on the focus exposure matrix wafer via a lithography system. The scatterometry measurement sites may be any periodic structure, as for example, one dimensional periodic structures situated in X or Y (such as line space gratings), or two dimensional periodic structures situated in X and Y (such as grid space gratings). The scatterometry measurement sites may be dedicated targets disposed around the device structures or they may a portion of the device structure (e.g., a periodic portion). As should be appreciated, using a portion of the device structure may be more difficult, but it tends to be more accurate since it is a portion of the device structure. Either way, the scatterometry measurement sites may be formed using a product mask or a test mask.

The scatterometry measurement sites are generally located across the focus exposure matrix wafer. In fact, there is generally one or more scatterometry measurement sites per field. The number of fields within each wafer may be widely varied. However, there is typically two or more fields per wafer. Each field is typically formed using a different combination of focus and exposure (or may be focus or exposure only). For example, a first field may be produced using a first combination, and a second field may be produced using a second combination that is different than the first combination. The multiple combinations can be produced using varying focus and varying exposure, varying focus—constant exposure, constant focus—varying exposure, and the like. In most cases, the scatterometry measurement sites have an identical pattern so that the different combinations may be properly characterized. It should be noted, however, that different focus exposure matrices may have different patterns. For example, a first test matrix may be performed using a first grating type and a second test matrix may be performed using a second grating type that is different than the first grating type.

The scatterometry measurement sites are generally located across the focus exposure matrix wafer. In fact, there are generally one or more scatterometry measurement sites per field. The number of fields within each wafer may be widely varied. However, there is typically two or more fields per wafer. Each field is typically formed using a different combination of focus and exposure (or may be focus or exposure only). For example, a first field may be produced using a first combination, and a second field may be produced using a second combination that is different than the first combination. The multiple combinations can be produced using varying focus and varying exposure, varying focus constant exposure, constant focus—varying exposure, and the like. In most cases, the scatterometry measurement sites have an identical pattern so that the different combinations may be properly characterized. It should be noted, however, that different focus exposure matrices may have different patterns. For example, a first test matrix may be performed using a first grating type and a second test matrix may be performed using a second grating type that is different than the first grating type.

After block 102, the process flow proceeds to block 104 where the scatterometry data (e.g., measure spectra) is interpreted into shape parameter information. This may be accomplished using iterative regression techniques and/or by library matching techniques such as those previously described, i.e., match the measured spectra with libraries that link profiles with spectra. In the technique generally described as iterative regression, one or more simulated spectra are compared to a measured spectrum creating a difference of error signal, then another simulated spectrum is calculated and compared to the measured spectrum. This process is repeated (iterated) until the error is reduced (regressed) to the specified value. One common method of iterative regression is non-linear regression. As can be appreciated different iterative regression algorithms that are familiar to those skilled in the art may be applied to the problem of interpreting measured scatterometry spectra through comparison with simulated spectra based on model profiles of scatterometry measurement targets. Block 102 may be performed by a computer system that may or may not reside in the scatterometry tool. The analysis performed by the computer system may be configured to produce results in real time (within 0 to 10 second of measurement), i.e., as each site is tested, or it may be delayed.

After block 104, the process flow proceeds to block 106 where focus exposure dependencies of shape parameters are determined. This is generally accomplished by matching the different focus-exposure combinations used to form the measurement sites with the appropriate profiles of the measured spectra. By appropriate, it is meant that the profiles and focus-exposure combinations come from the same measurement sites. As should be appreciated, the profiles contain a plurality of different shape parameters and thus the different focus exposure combinations may also be matched to the different shape parameters of the corresponding profile. The matched data (e.g., multiple data points) may be used to form focus exposure dependencies on shape parameters. The focus exposure dependencies on shape parameters may be take the form of graphical plots or equations. Also, focus exposure dependencies on shape parameters may take the form of learned relationships such as those generated by artificial intelligence, neural networks and the like.

By way of example, the graphical plots may be Bossung Plots that plot individual shape parameters vs. focus position for varying levels of exposure dose, i.e., the varying levels of exposure are plotted as contour lines with the shape parameter representing the Y axis and focus position representing the X axis of the graph. Alternatively, the Bossung Plot may be inverted such that it plots exposure vs. focus for varying values of an individual shape parameter, i.e., the values of the shape parameter are plotted as contour lines with exposure representing the Y axis and focus position representing the X axis of the graph. As should be appreciated, each plot may represent a different equation. The Bossung plots may be overlapped to form a process window. The overlapped Bossung plots may be from the same grating type or they may be from different grating types.

After block 106, the process flow proceeds to block 108 where the optimum focus and exposure of the lithography system is determined. This is generally accomplished by choosing a desired value of one or more shape parameters, i.e., the one that is desired to be printed on the wafer, and matching it to the dependencies so as find the optimum focus and exposure for the desired value of the shape parameter. The optimum focus exposure conditions can be used to control the lithographic process. Multiple shape parameters may be used simultaneously to find a unique solution or to form a process window that keeps the shape parameters within desired tolerances. An optimal solution may be found in the process window via error minimization. In one example, multiple shape parameters are plotted on the same Bossung Plot to find the optimum focus and exposure, i.e., the intersection of the desired shape parameter contour lines.

Figure 3:
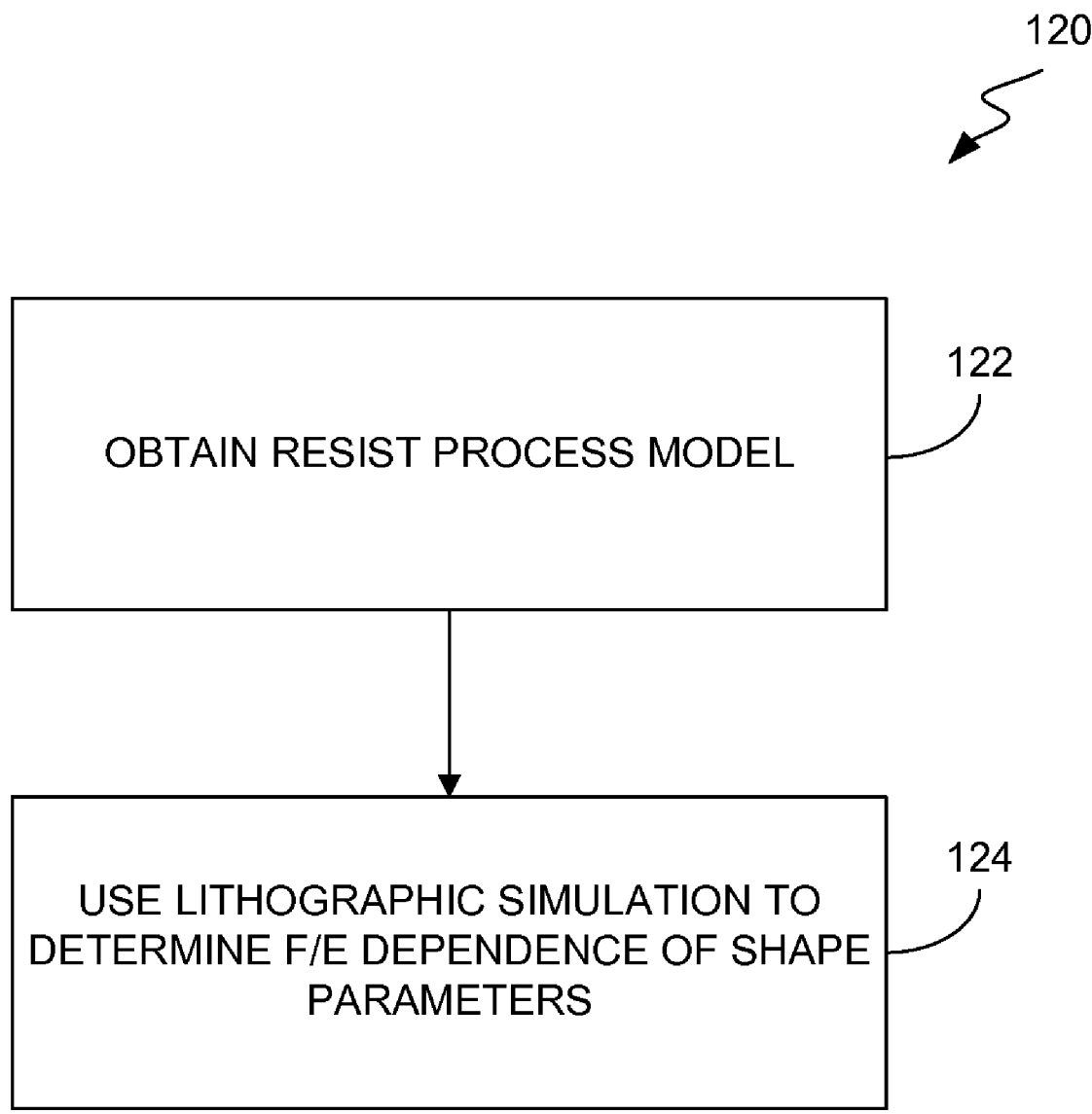
FIG. 3 is a method for determining dependences of shape parameters, in accordance with one embodiment of the present invention.

FIG. 3 is a method for determining dependences of shape parameters 120, in accordance with one embodiment of the present invention. The method generally begins at block 122 where a resist process model is obtained. The resist process model is used with the lithography simulation program to calculate simulated resist profiles that are determined to be substantially accurate by comparison to measured resist profiles. The resist process model is configured to relate or integrate resist information about a particular process. For example, it may relate resist preparation, resist thickness, resist sensitivity to illumination, resist development, and resist thermal processes, and the like.

Following block 122, the process flow proceeds to block 124 where lithographic simulation methods are used to determine F/E dependence of shape parameters. This is generally accomplished by translating the simulated resist profiles into approximate profiles described by the shape parameters that are used in scatterometry analysis systems.

Figure 4:
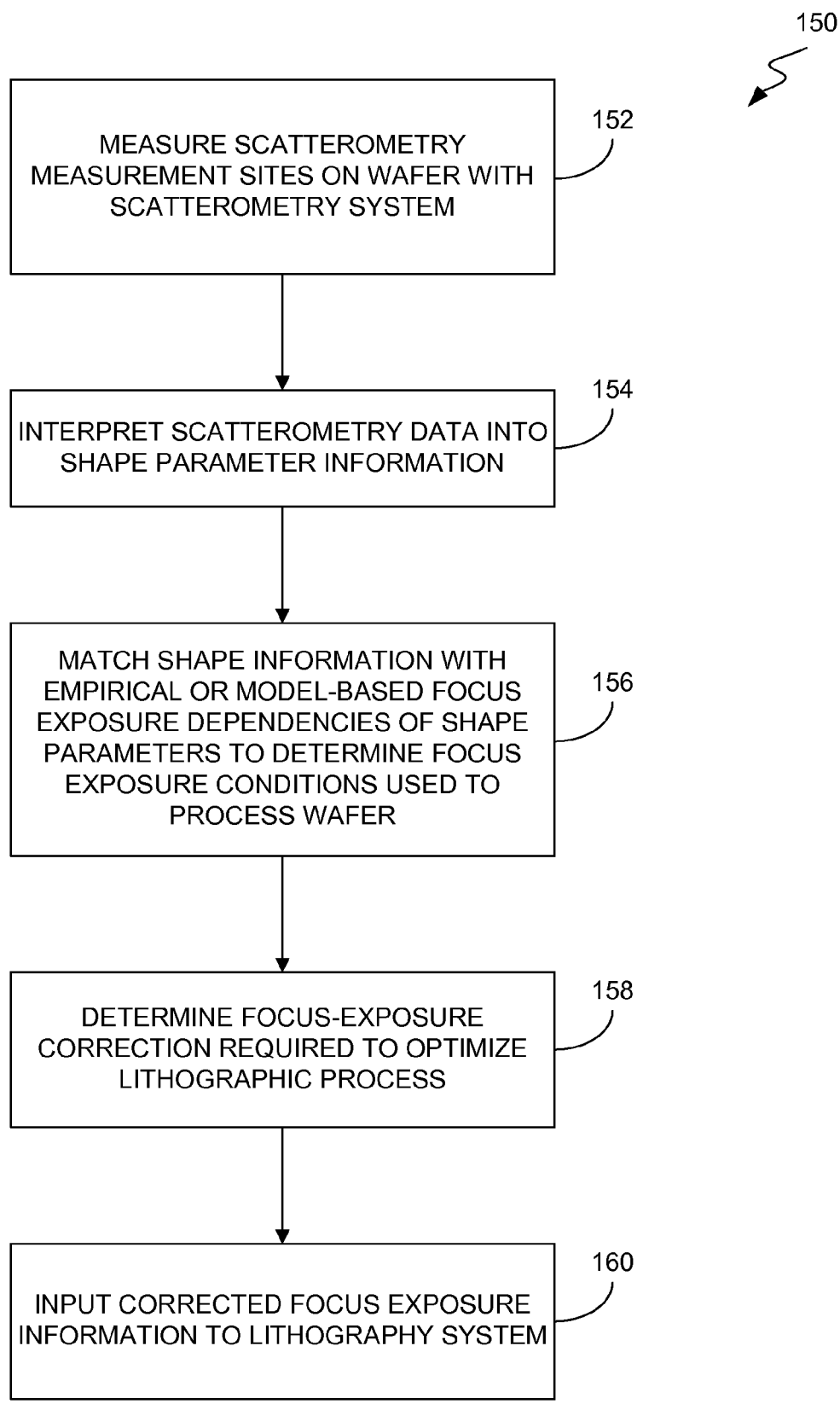
FIG. 4 is a flow diagram of focus exposure monitoring, in accordance with one embodiment of the present invention.

FIG. 4 is a flow diagram of focus exposure monitoring 150, in accordance with one embodiment of the present invention. The method generally begins at block 152 where scatterometry measurement sites on a wafer are measured with a scatterometry system. The scatterometry measurement sites and scatterometry system generally correspond to the scatterometry sites and scatterometry system described in FIG. 2. The difference is that the measurement sites are on a production wafer or a test wafer not a focus exposure matrix wafer. That is, the production and test wafers are being processed at nominal focus and exposure conditions rather than varying combinations thereof. For example, the optimal focus and exposure condition found in block 108 of FIG. 2 may be used as the nominal focus and exposure conditions. The number of measurement sites may also differ. The number of sites per field is generally smaller on production wafers since the real estate on production wafers is so valuable. Also, fewer measurements are made on a product wafer than on a focus exposure matrix wafer due to time constraints in production. In one embodiment, a single site is measured per field. In another embodiment, multiple sites are measured per field. As should be appreciated, scatterometry is one of the few types of metrology that has true in-situ potential for controlling focus and or exposure during a production run, i.e., it is suitable for die to die, wafer to wafer, run to run monitoring (and the like).

After block 152, the process flow proceeds to block 154 where the scatterometry data obtained in block 152 is interpreted into shape parameter information. This may be accomplished in the same manner as block 104 in FIG. 2. As should be appreciated, even though scatterometry may be performed on one site, multiple shape parameters may be determined, i.e., scatterometry allows one measurement to produce multiple data inputs. For example, two or more shape parameters may be determined at one measurement site.

After block 154, the process flow proceeds to block 156 where the shape parameter information determined in block 154 is matched with focus exposure dependencies of shape parameters to determine focus-exposure conditions used to process the measured wafer. The shape information may be from a single measurement site or from multiple measurement sites. As should be appreciated, with two of these variables you are able to solve for two unknowns—focus and exposure. The matching may performed using graphical plots or equations. In one embodiment, inverted plots or inverted equation are used. For example, an inverted Bossung Plot having Exposure vs. Focus for constant shape parameters is used. In order to solve for both focus and exposure, two or more plots may be overlapped. In addition, inverted equations such as Focus as a function of line width and height or Exposure as a function of height and sidewall angle may be used.

After block 156, the process flow proceeds to block 158 where the focus-exposure correction required to optimize lithographic process is determined. This is generally accomplished by comparing the focus and exposure values obtained in the previous block with the focus and exposure values that were nominally set. The correction may include information corresponding to the difference between the "measured" value (block 154) and the nominally set values. For example, if the nominally set exposure dose was 22, and the measured exposure dose was found to be 27, then the difference of 5 may be used to correct the process, i.e., to get the exposure dose to produce the correct shape parameters during subsequent runs.

After block 158, the process flow proceeds to block 160 where the corrected focus-exposure information is inputted into the lithography system. The corrected focus exposure information may be inputted manually by an operator or automatically by the system. In most cases, the corrections are fed into a program or computer that analyzes and decides what actual collection to make. For example, the decision may be to not make a correction because it is too small. In addition, there may be other information from other processes that may alter the overall correction.

In accordance with one embodiment, resist loss (the difference between the original resist thickness or the thickness of large unpatterned resist area (>about 20 um square) and the grating height) can also be used as a parameter in focus exposure analysis. Measurement of resist film thickness after the resist develop process and direct calculation of the relative resist loss for the gratings can partially compensate for resist coating and development process variations that can make interpretation of resist height difficult. The resist thickness measurement can be done in the same sequence of measurements as the scatterometry grating measurements.

In accordance with another embodiment, the multiple shape parameters found in any of the above methods may be shape parameters from two or more different type of scatterometry measurement sites including sites that differ in shape (line, contact, square or rectangular line segments), differ in pitch, differ in feature width or size but substantially equal in pitch, differ in mask construction (binary mask features vs. phase shift mask features), differ in position (placed at different locations on the mask), or differ in grating orientation (X, Y, X and Y). As should be appreciated, different shapes and pitches exhibit different response to focus errors, and therefore it may be advantageous to measure distinct scatterometry measurement sites having different characteristics. An example of solving for focus and exposure using linewidths (critical dimension or MCD) measured for two different line grating targets is given in FIG. 11. An example of solving for focus and exposure using MCD data from one line grating target and sidewall angle and resist loss measured for a line grating target with different pitch is given in FIG. 12.

In accordance with another embodiment, the shape information from multiple measurement sites in a stepper exposure field can also be analyzed to determine the imperfections or optical aberrations of the stepper lens system. This information can be used to adjust or repair the stepper lens system, to choose optimum stepper operating parameters to minimize the negative impact of optical aberrations, or to monitor the stability of the stepper lens system.

Figure 5:
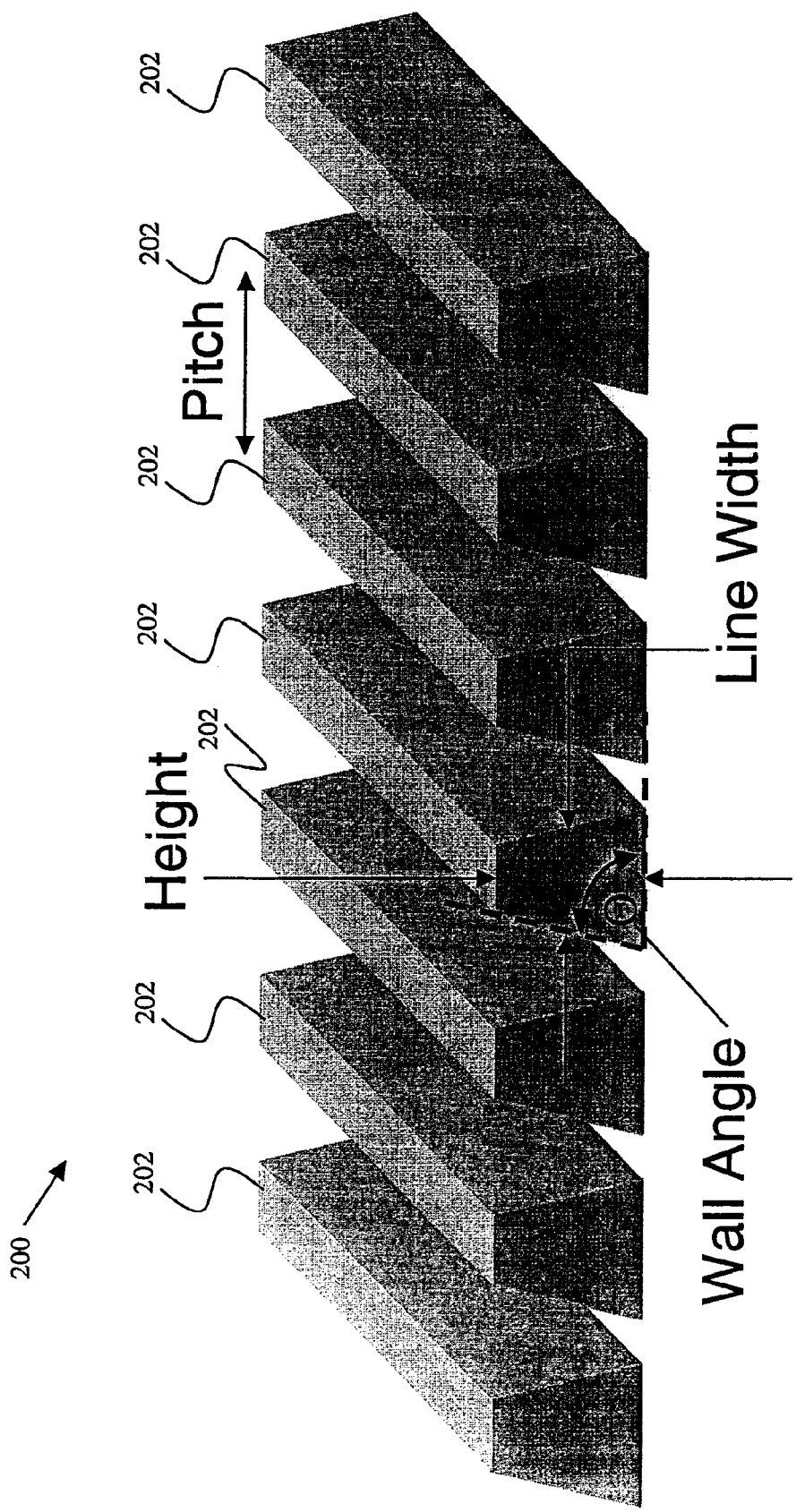
FIG. 5 is a simplified diagram of a line space grating, in accordance with one embodiment of the present invention.

FIG. 5 is a simplified diagram of a line space grating 200, in accordance with one embodiment of the present invention. The line space grating is generally provided to improve the focus and/or exposure control of subsequent lithographic patterning and to determine whether the quality of the photolithographic pattern meets specified requirements. The line space grating may be used in any of the methods described herein. For example, the line space grating may be printed on a focus exposure test matrix wafer (block 12 in FIG. 1), a test wafer or a production wafer (block 14 in FIG. 1). The focus exposure matrix wafer as well as the test wafer are generally used for testing the lithography equipment rather than for generating a product. Any number of line space gratings may be positioned on the wafers. Generally speaking, about 1 to about 10 gratings per field may be used on production wafers while up to 1000's of gratings per field may be used on focus exposure matrix wafer and test wafers. The line space grating(s) may be patterned using suitable photolithographic techniques. In most cases, the line space grating is printed in a layer of photoresist using a stepper or scanner lithography system. As should be appreciated line space gratings such as these are especially useful when using scatterometry measurement techniques.

As shown, the line space grating 200 is formed by a plurality of spaced apart parallel lines 202. Each of the parallel lines is defined by several shape parameters. The shape parameters may be related to the cross sectional shape of the line, as for example, line width, height, and wall angle or they may be related to a relationship between lines, as for example, pitch. Height is the term used to describe the length of the line from its bottom to its top. Line width (CD) is the term used to describe the width of the line. The line width may be taken any where along the height of the line, for example, the bottom, middle or top or anywhere therebetween (width is generally along the dimension parallel to the wafer and perpendicular to the line—in the same direction that defined the grating pitch or period). One may also use the linewidth measured at 2 or more different heights as separate measurement shape parameters. The wall angle is the term used to describe the angle between the line's sidewall and the line's base. Pitch, on the other hand, is the term used to describe the distance between lines. Pitch may be measured from the center or edges of the lines. Although, only these shape parameters are shown, it should be noted that these shape parameters are not a limitation. As should be appreciated, the profile shown in FIG. 5 is base on a trapezoidal model. In practice, the profile may not be a trapezoid, it may in fact be widely varied therefrom. For example, it may be some shape altogether different than a trapezoid or it may be a variation of the trapezoid (it may be rounded at the top corners or at the bottom corners, it may have bowed or curved sidewalls, and the like). Theses parameters (e.g., the radius of curvature of the rounded corners) may also be used as shape parameters. The shapes may also be described in terms of shapes calculated using lithographic process simulation software such as PROLITH from KLA-Tencor or other software capable of simulating the resist profile.

Figure 6:
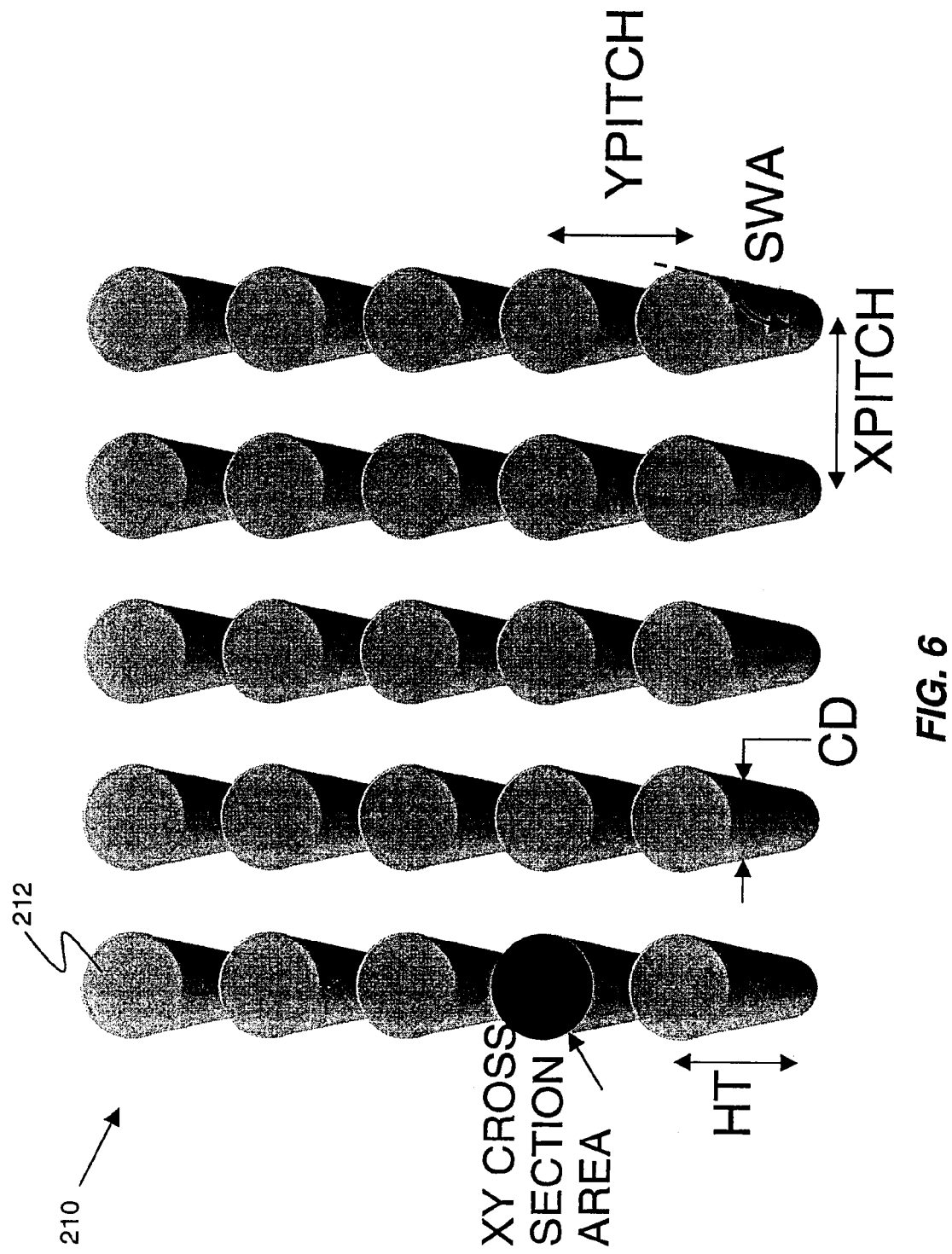
FIG. 6 is a simplified diagram of a grid space grating, in accordance with one embodiment of the present invention.

The line space grating may be modified to form a grid space grating with spacing and shape parameters in both X and Y dimensions (XY plane is defined as the plane parallel to the wafer or substrate surface). By way of example, FIG. 6 is a simplified diagram of a grid space grating 210, in accordance with one embodiment of the present invention. As shown, the grid space grating includes a plurality of spaced apart elements 212. Each of these elements is defined by several shape parameters. The shape parameters of a grid space grating may be related to height, CD (which is similar to linewidth), wall angle, Y-pitch, X-pitch and XY cross sectional area. Although, only these shape parameters are shown, it should be noted that these shape parameters are not a limitation. For example, although a cylindrical or truncated profile is shown in FIG. 5, other profiles such as rectangular, square, triangular, oval, hexagonal, truncated cone, cross, "L"-shape, rounded rectangle and the like (any arbitrary shape) may be used. Furthermore, although a symmetrical pattern is shown (the pitch is equal in the X and Y directions), it should be noted that asymmetrical patterns may be used. For example, the pitch may not be equal in the X and Y directions (e.g., longer in X, shorter in Y, etc.). Moreover, although the pattern is shown in consecutive linear columns and rows, it should be noted that this is not a limitation and that diagonal rows and columns may also be used (or any combination thereof). For example, the pattern may take the form of a hexagonal array. Other examples of patterns that may be measured with scatterometry include segmented lines (rectangular arrays of nominally rectangular line segments) or off-set or staggered "brick-wall" patterns familiar to those skilled in the art.

Figure 7:
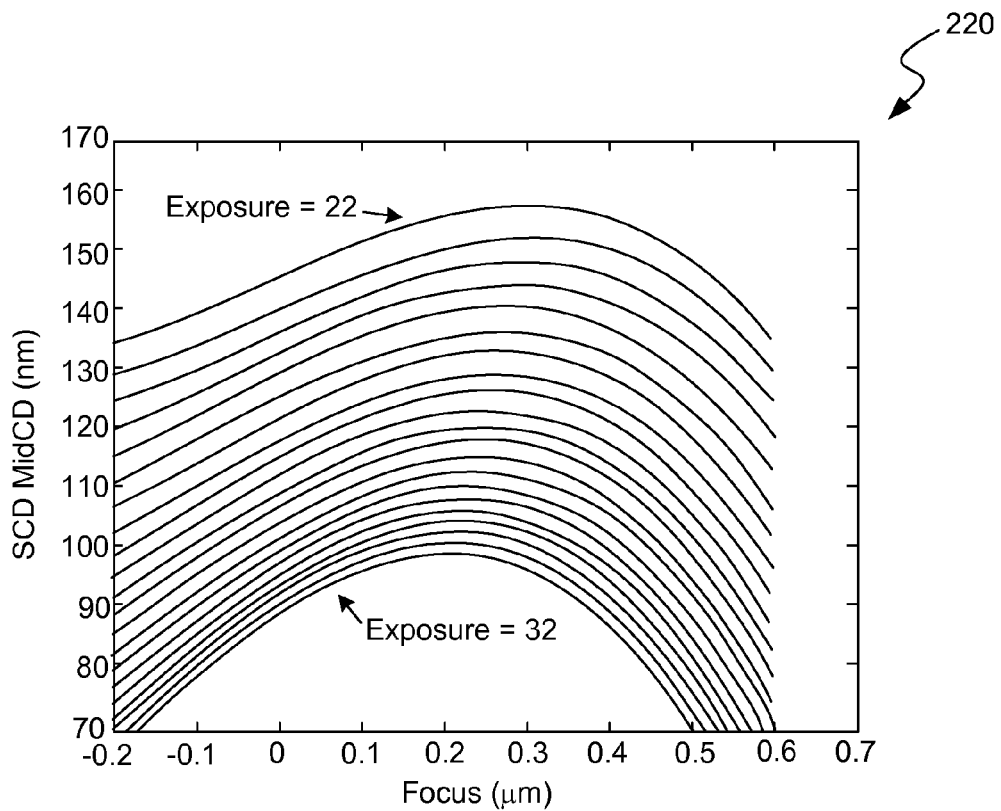
FIG. 7 is a Bossung Plot of MidCD (linewidth at 50% of profile height), in accordance with one embodiment of the invention.

FIG. 7 is a Bossung Plot 220, in accordance with one embodiment of the invention. The Bossung Plot illustrates curves of the focus exposure dependence of line width at 50% of height for a line space grating designed for 150 nm line width and 750 nm pitch. Each curve represents the focus dependence of line width for a constant exposure. The different curves are for exposure ranging from 22 to 32 exposure units in increments of 0.5. By way of example, the Bossung plot may be generated from data produced by a focus exposure test matrix using scatterometry techniques.

Figure 8:
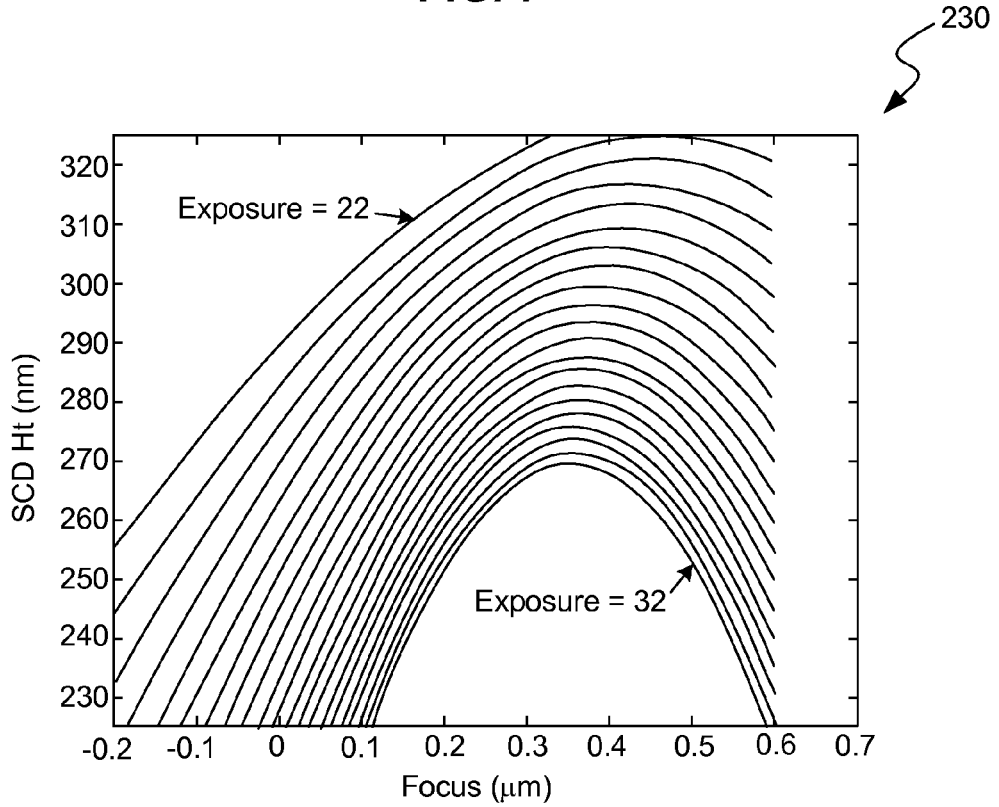
FIG. 8 is a Bossung Plot of profile height, in accordance with another embodiment of the invention.

FIG. 8 is a Bossung Plot 230, in accordance with another embodiment of the invention. The Bossung Plot illustrates curves of the focus exposure dependence of height for a line space grating designed for 150 nm line width and 750 nm pitch. Each curve represents the focus dependence of height for a constant exposure. The different curves are for exposure ranging from 22 to 32 exposure units in increments of 0.5. By way of example, the Bossung plot may be generated from data produced by a focus exposure test matrix using scatterometry techniques. The linewidth data points in FIG. 6 and the height data points in FIG. 7 may be determined from the same or different scatterometry measurement(s) (e.g., same measurement site or different measurement sites).

Figure 9A:
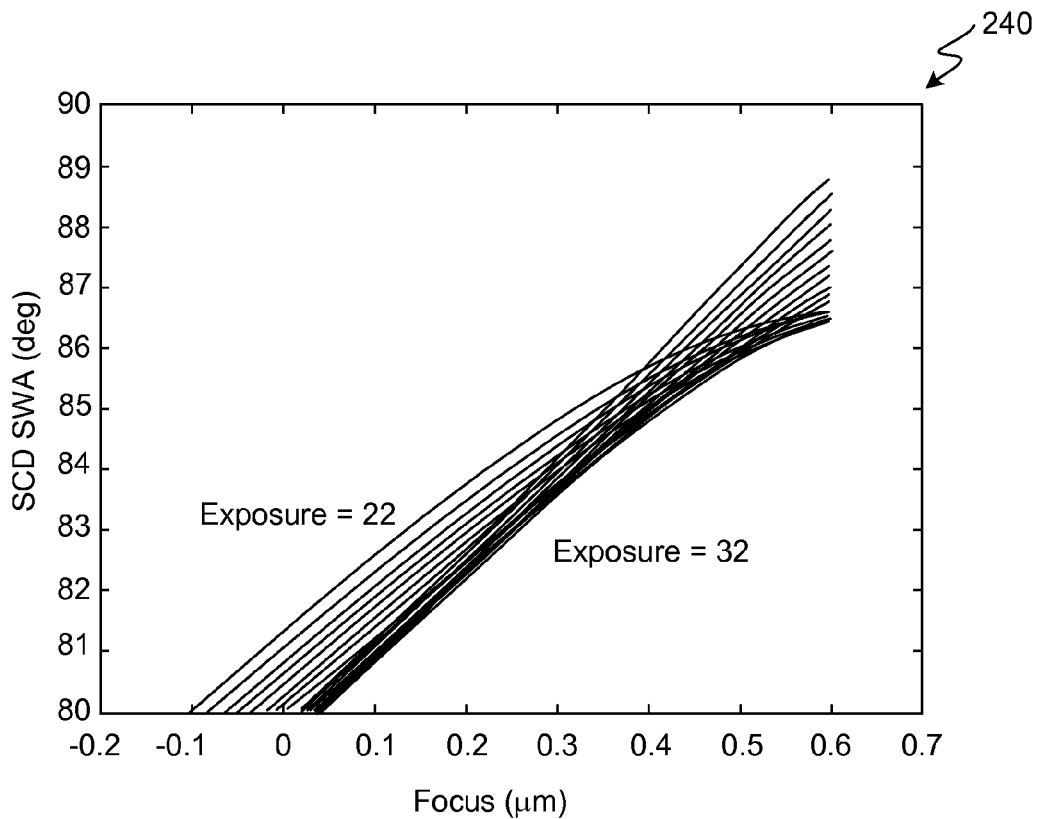
FIGS. 9a and 9b are Bossung Plot s of sidewall angle, in accordance with another embodiment of the invention.
Figure 9B:
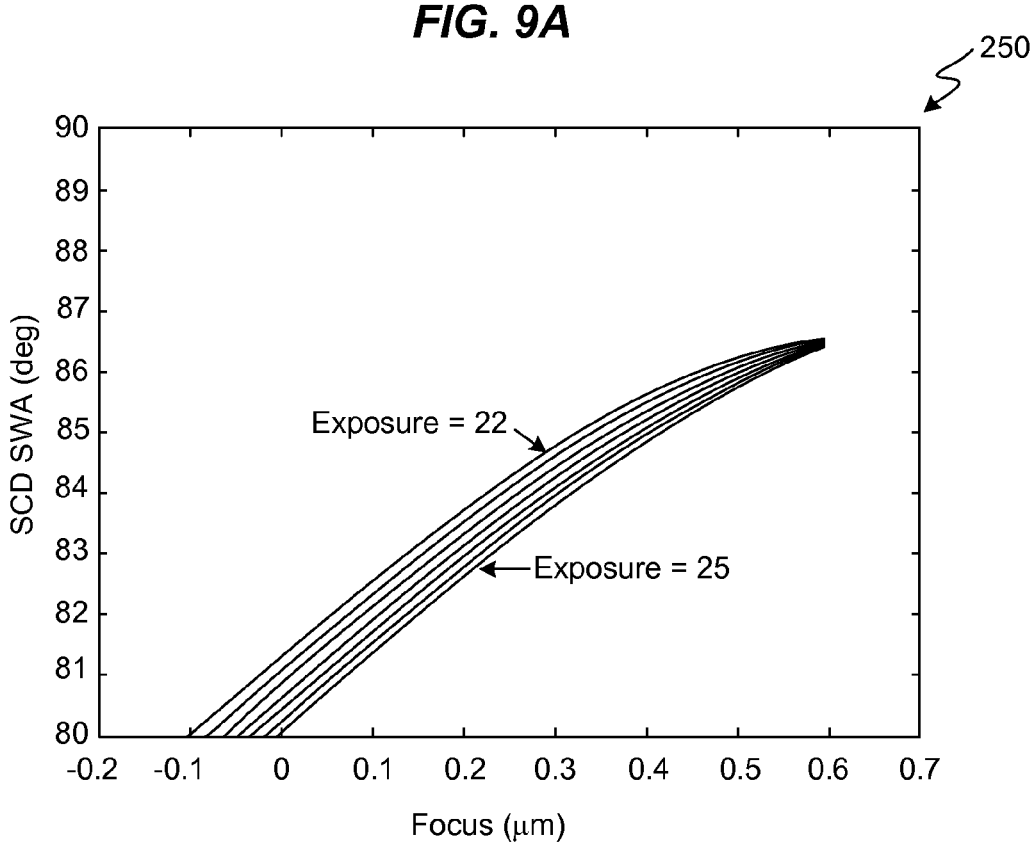

FIGS. 9*a* and 9*b* are Bossung Plots 240 and 250 respectively, in accordance with another embodiment of the invention. For reasons of clarity, FIG. 8*b* shows a subset of the focus exposure range of FIG. 8*a*. The Bossung Plots illustrate curves of the focus exposure dependence of sidewall angle for a line space grating designed for 150 nm line width and 750 nm pitch. Each curve represents the focus dependence of height for a constant exposure. The different curves are for exposure ranging from 22 to 32 exposure units in increments of 0.5. By way of example, the Bossung plot may be generated from data produced by a focus exposure test matrix using scatterometry techniques. The linewidth data points in FIG. 6, the height data points in FIG. 7 and the side wall angle data points in FIG. 8 may be determined from the same or different scatterometry measurement(s) (e.g., same measurement site or different measurement sites).

FIGS. 10*a* and 10*b* are overlapped Bossung Plots 260 and 270 respectively, in accordance with another embodiment of the invention. For reasons of clarity, FIG. 10*a* shows an example of a subset of the data contained in FIG. 10*b*. The overlapped Bossung Plots are inverted and include a first Bossung Plot 262 and a second bossung plot 264. By way of example, the first bossung plot may be the inverted version of the bossung plot shown in FIG. 7 and the second bossung plot may be the inverted version of the bossung plot shown in FIG. 8. The overlapped Bossung plots illustrate contours of constant line height 265 and line width 263 at 50% line height for a line space grating designed for 150 nm line width and 750 nm pitch. Each curve represents either the linewidth or height. In FIG. 10*a*, the different curves of linewidth are for linewidths 120 nm, 123 nm, and 126 nm, respectively, and the different curves of height are for heights 284 nm, 290 nm, and 296 nm, respectively. As shown in both figures, a pair of specific contours of line height and line width intersects at only one focus-exposure combination, demonstrating a unique simultaneous solution for both focus and exposure. For example, referring to FIG. 9*a*, if the line width was determined to be 123 nm, and the height was determine to be 284 nm (as for example in block 14 of FIG. 1), then the exposure would be approximately equal to 26 units and the focus would be approximately equal to 0.2 um.

Figure 11:
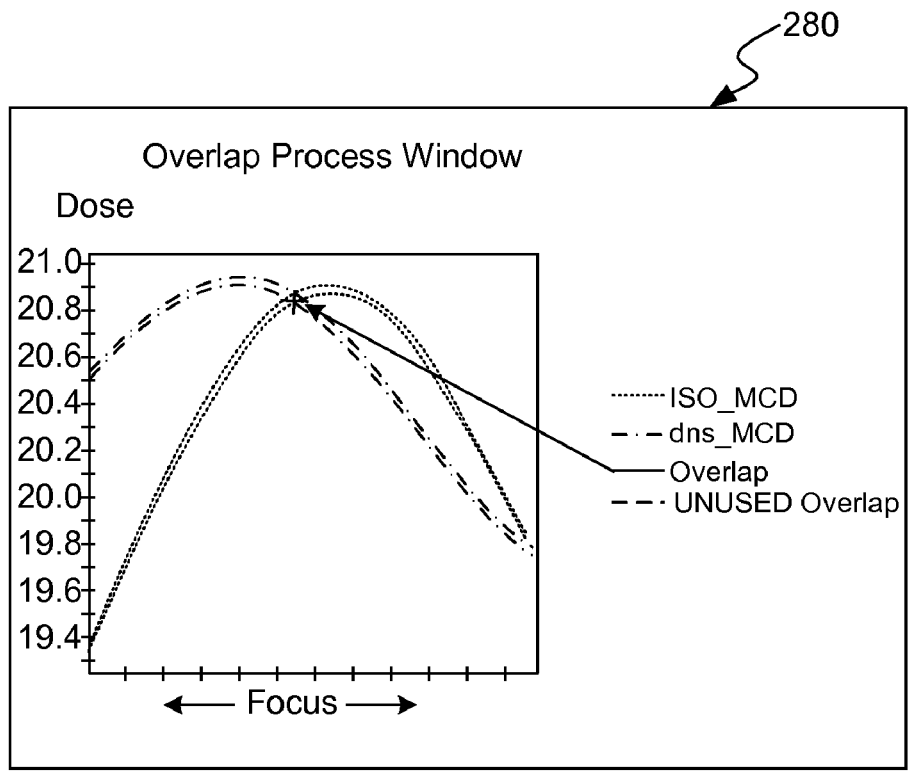
FIG. 11 is an example of an overlapped Bossung Plot, in accordance with one embodiment of the present invention.

FIG. 11 is an example of an overlapped Bossung Plot 280, in accordance with one embodiment of the present invention. The overlapped bossung plot is configured to demonstrate a unique solution for focus and exposure determined from middle CD measurements on two different line grating types (e.g., two different scatterometry measurement sites). In this example, the different gratings had different pitches, around 1:5 line to space ratio (labeled ISO_MCD) and around 1:1.6 line to space ratio (labeled dns_MCD). The overlap region contains the solution for the focus and exposure required to produce the linewidths (critical dimension, MCD) measured independently for the different grating types.

Figure 12:
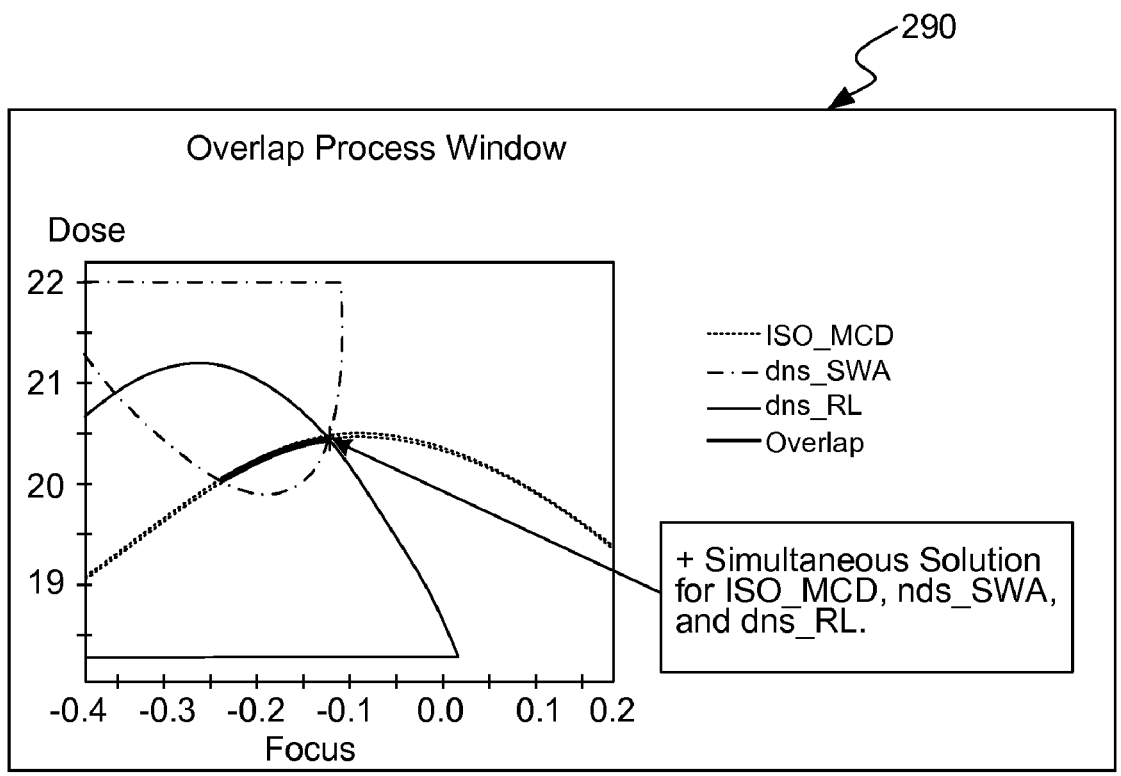
FIG. 12 is an example of an overlapped Bossung Plot, in accordance with one embodiment of the present invention.

FIG. 12 is an example of an overlapped Bossung Plot 290, in accordance with one embodiment of the present invention. The overlapped bossung plot is configured to demonstrate a unique solution for focus and exposure determined from middle CD measurements on a first line grating type and side wall angle (SWA) and resist loss (RL) measurement on a different line grating with a different pitch. In this example, the different gratings had different pitches, around 1:5 line to space ratio (labeled ISO_MCD) and around 1:1.6 line to space ratio (labeled dns_SWA, dns_RL). The solution is graphically shown as the intersection or enclosed region indicated by the "+" sign. The "+" sign schematically indicates the solution for the focus and exposure required to produce the shape parameters (critical dimension, MCD, sidewall angle, resist loss) measured independently for the different grating types.

Figure 13:
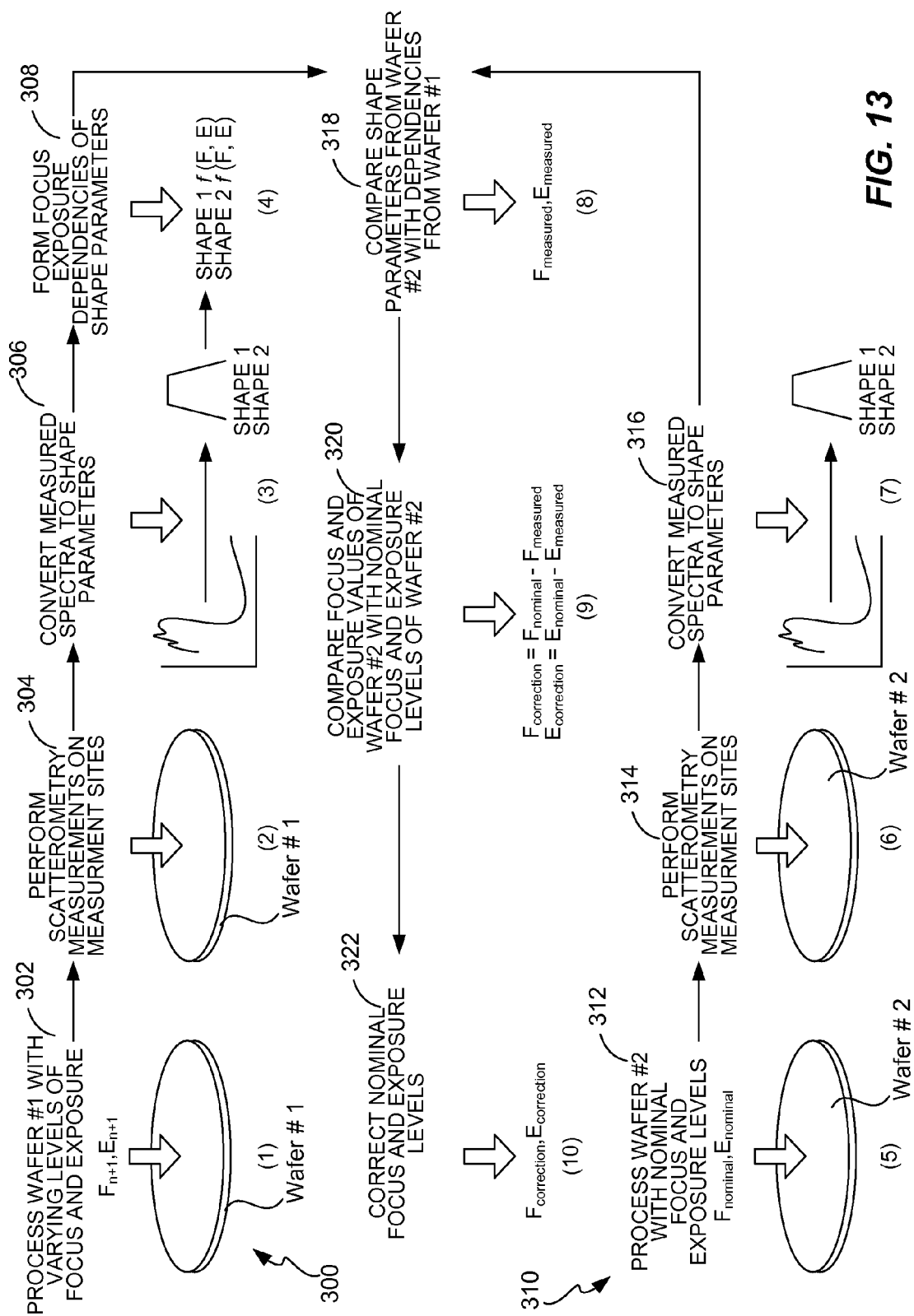
FIG. 13 is a schematic presentation of a method of monitoring focus and exposure, in accordance with one embodiment of the present invention.

FIG. 13 is a schematic presentation of a method of monitoring focus and exposure 300, in accordance with one embodiment of the present invention. The method 300 generally begins at step 302 where a first wafer is processed with varying levels of focus and exposure. The processing generally includes of printing a plurality of scatterometry measurement sites in a layer of photoresist with a lithography system (e.g., on a focus exposure test matrix wafer). Following step 302, the process flow proceeds to step 304 where scatterometry measurements are performed on the scatterometry measurement sites (e.g., periodic structures such as line space or grid space gratings). This is generally accomplished with a scatterometry measurement tool such as those based on spectroscopic ellipsometry or spectroscopic reflectometry. The scatterometry measurements are generally in the form of measured spectra. Following step 304, the process flow proceeds to step 306 where the measured spectra is converted into shape parameters. For example, first and second shape parameters may be found for a given scatterometry measurement site profile (e.g., trapezoid). Following step 306, the process flow proceeds to step 308 where focus and exposure dependencies of shape parameters are formed. For example, dependencies such as a first shape parameter as a function of focus and exposure, as well as a second shape parameter as a function of focus and exposure may be formed. The method continues in a separate process flow 310 that generally occurs after steps 302-308. The separate process flow may occur during a production run.

The separate process flow 310 generally begins with step 312 where a second wafer is processed with nominal focus and exposure levels. The nominal focus and exposure values generally correspond to what is believed to be the best focus and exposure. The processing generally includes printing a plurality of scatterometry measurement sites in a layer of photoresist with a lithography system (e.g., on a production wafer). The lithography system may be the same system used in step 302. Following step 312, the process flow proceeds to step 314 where scatterometry measurements are performed on the scatterometry measurement sites (e.g., periodic structures such as line space or grid space gratings). This is generally accomplished with a scatterometry measurement tool such as those based on spectroscopic ellipsometry. The scatterometry tool may be the same scatterometry tool used in step 304. The scatterometry measurements are generally in the form of measured spectra. Following step 314, the process flow proceeds to step 316 where the measured spectra is converted into shape parameters. For example, first and second shape parameters may be found for a given scatterometry measurement site profile (e.g., trapezoid) or they may be found for a plurality of scatterometry measurement site profiles.

Following step 316, the process flow proceeds to step 318 where the shape parameters found in step 316 are compared with the dependencies found in step 308. This generally results in a measured value for focus and exposure. The measured values generally correspond to the actual values for focus and exposure of the lithography system although nominal values were set. As should be appreciated, focus and exposure settings may fluctuate or change over the course of a production run, from run to run, or the life of the lithography tool. Following step 318, the process flow proceeds to step 320 where the measured focus and exposure values found in step 318 are compared with the nominal focus and exposure values used in step 312. This typically results in a correction factor for both focus and exposure. Following step 320, the process flow proceeds to step 322 where the nominal focus and exposure values are corrected using the correction factor determined in step 320. The second process flow 310 may be performed continuously or incrementally over a production run to ensure that the profiles of the integrated circuits printed thereon meet specified requirements. The first process flow, steps 302-308, may be performed incrementally as needed to ensure that the dependencies are accurate.

The advantages of the invention are numerous. Different embodiments or implementations may have one or more of the following advantages. One advantage of the invention is that it may provide a unique determination of focus and/or exposure. Another advantage of the invention is that it allows for simultaneous solution of focus and exposure. Another advantage of the invention is that it uses shape information derived from scatterometry to determine best focus and/or exposure and to determine the stepper or scanner focus and/or exposure on nominally processed wafers. Another advantage of the invention is that the scatterometry techniques may use wavelengths longer than feature size (it has been found that wavelengths smaller than feature size are difficult to obtain when the feature size is less than 250 nm). Another advantage of the invention is that it allows for a unique determination of focus and exposure from scatterometry shape information. Another advantage of the invention is that it uses more of the available shape information to obtain a better determination of focus and/or exposure. Another advantage of the invention is that it allows for more complex grating targets than lines and spaces. Another advantage of the invention is that it not affected by image threshold settings as in CD-SEM. Another advantage of the invention is that it is more precise than optical imaging measurements of line end shortening, and is capable of compensating for changes in the underlying film thickness.

Furthermore, in contrast to the present invention, CD-SEM and line end shortening methods cannot be performed with scatterometry, nor can they obtain good quality shape information outside of the XY plane. For example, they cannot obtain shape information on grating target elements in the Z direction normal to the wafer surface. Line end shortening methods for focus exposure monitoring do not simultaneously provide line width or other critical dimension information, thus requiring another set of measurements to determine these.

While this invention has been described in terms of several preferred embodiments, there are alterations, permutations, and equivalents, which fall within the scope of this invention. For example, although MidCD or middle CD, which is the width at 50% of the profile height, is mentioned above, it should be noted that the width at any height can be used as a shape parameter or the width at two or more heights can be used for two different shape parameters (the same can be said for some of the other shape parameters as well). In addition, although the term wafer was used throughout (e.g., semiconductor), it should be noted that the term wafer may also apply to workpieces, substrates, samples and the like (which are associated with other types of manufacturing) when the methods of the invention are used in other types of manufacturing. Furthermore, it should be appreciated that the shape parameters are not limited to those described herein, and may be widely varied therefrom. For example, shape parameters such as cross sectional area, volume, and the like may be used. It should also be noted that there are many alternative ways of implementing the methods and apparatuses of the present invention. For example, although the invention has been described in terms of photolithography that uses conventional radiation techniques, it should noted that other lithography techniques may also be used, for example, UV lithography (which uses ultra violet), X-ray lithography (which uses X-ray), e-beam lithography (which uses electron beam), and ion beam (which uses ion beam).

Furthermore, the shape information (that are obtained via scatterometry, for example) from multiple measurement sites (nominally identical) in a stepper or scanner exposure field can also be analyzed to determine the imperfections or optical aberrations of the stepper lens system. This information can be used to adjust or repair the stepper lens system, to choose optimum stepper operating parameters to minimize the negative impact of the optical aberrations, or to monitor the stability of the stepper lens system. One method would convert the shape information for each measurement location to an effective focus error value at that measurement location (focal plan deviation). Another method would determine the best focus for each measurement location in the field by measuring a focus exposure matrix wafer at multiple sites in the field. These focal plane deviations then could be analyzed to determine the optical aberrations generally termed spherical aberration, coma, astigmatism, curvature of field, and distortion. The most common descriptions of optical aberrations are Seidel aberrations and Zernike polynomials.

The scatterometry measurements can also be performed on measurements targets or measurement areas generated with different target orientations (vertical versus horizontal or any angle of the target symmetry axis), or stepper optical settings such as varying numerical aperture, coherence, illumination conditions, etc. to separate the contributions of different aberrations or different Zernike terms. The scatterometry shape information from multiple target types differing in pitch, orientation, element shape or size, etc may also be combined to determine the optical aberrations.

Some aberrations, including coma may also create asymmetry in the resist profile resulting in a profile that may be better described as a "tilted trapezoid" with a "central line" that is not normal to the wafer surface. The angle of this central line is another shape parameter that may be used to determine the aberrations of the system. The average sidewall angle or the difference between the sidewall angles on the left and right sides of the line may also be used to determine the aberrations.

Scatterometry measurement masks features can also be designed to be more sensitive for specific aberrations. The resist line widths of the left and right lines (or top and bottom lines) printed with a 2-bar target are commonly measured with CD-SEMs to evaluate coma aberrations. (Reference: M. Moers, et al, SPIE Optical Microlithography XIV, Vol 4346 p. 1379, (2001)). A scatterometry measurement target can be constructed of repeating units of a 2 bar target (left line denoted A, right line denoted B, with space S between the lines A and B of the unit cell) distributed on a pitch P. The pitch P should be as large as is practical for the scatterometry measurement system. Scatterometry measurements can be performed on the scatterometry 2-bar target to determine the shape parameters for the lines A and B. One measure of the effects of the aberrations could be the difference of the widths of the lines A and B, W(A)−W(B) or the normalized difference, ((W(A)−W(B))/((W(A)+(W(B))). Another measure of the effects of the aberrations could be the difference in the heights of the lines A and B H(A)-H(B) or the normalized difference ((H(A)-H(B))/((H(A)+(H(B))). The shape information determined from scatterometry measurements for multiple measurement locations in the stepper or scanner field is then evaluated to determine the aberrations. It is useful to compare the measured shape parameters with resist profiles calculated with lithography simulation software that can include the effects of aberrations in the simulation.

Figure 14:
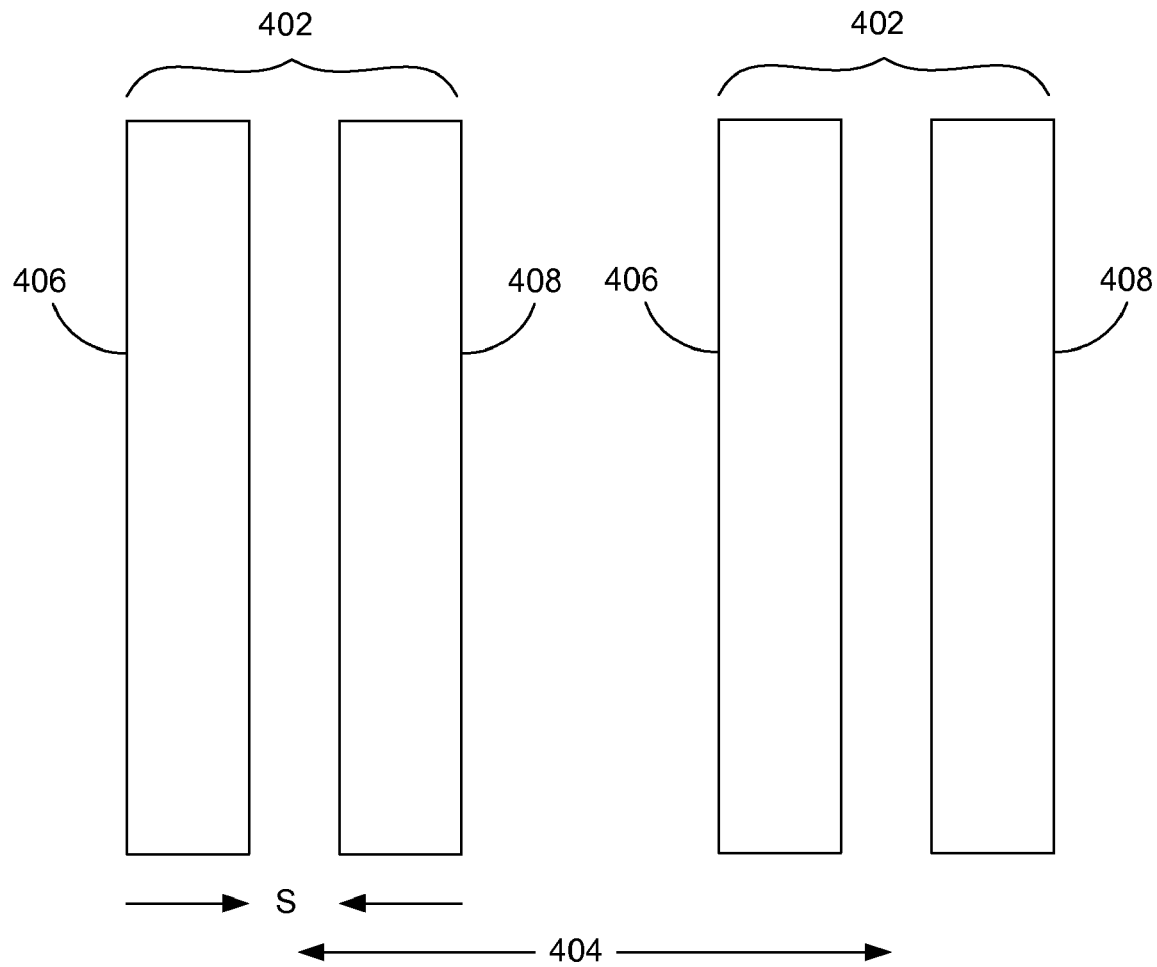
FIG. 14 is a simplified top view diagram of a scatterometry target that may be used to determine the optical aberrations of a lithographic system, in accordance with one embodiment of the present invention.
Figure 15:
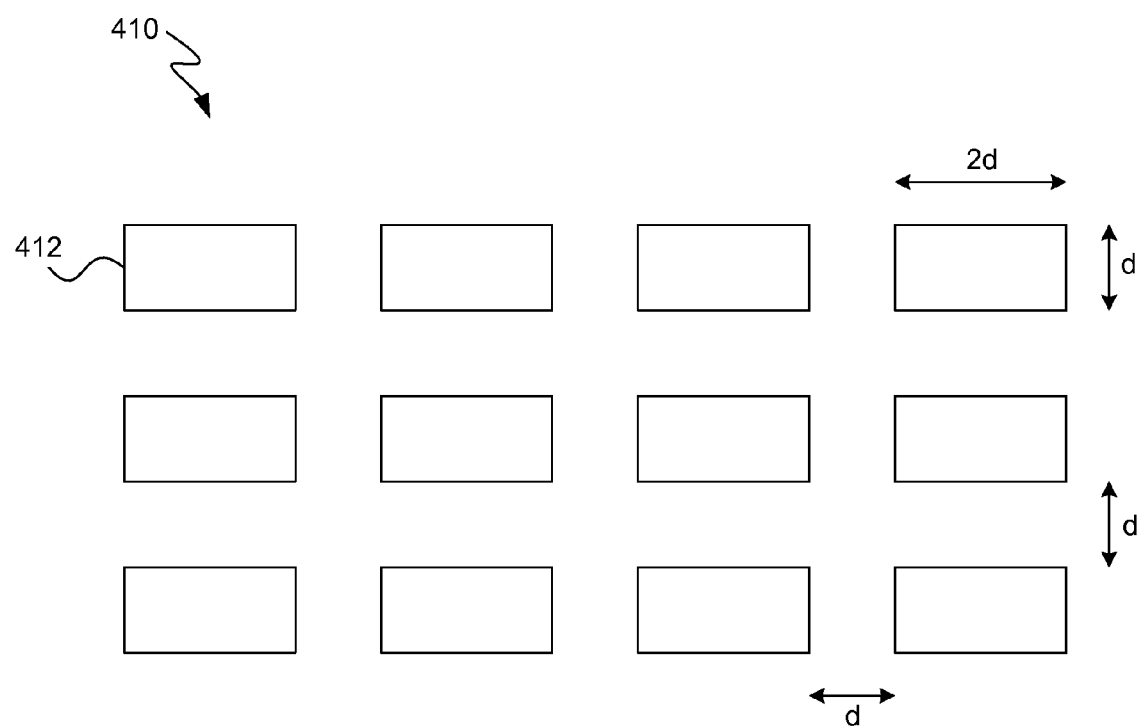
FIG. 15 is a simplified top view of a scatterometry target that may be used to determine the process parameters or optical aberrations of a lithographic system, in accordance with one embodiment of the present invention.

Moreover, the scatterometry measurement sites may be widely varied. For example, FIG. 14 is a simplified top view diagram of a scatterometry target 400 that may be used to determine the optical aberrations of a lithographic system, i.e., the aberration target is sensitive to certain aberrations. As shown, the aberration target 400 includes a plurality of units 402 that repeat at intervals of pitch 404. The units 402 are formed by two lines or bars 406, 408 that are separated by a space S. FIG. 15 is a simplified top view of a scatterometry target 410 that may be used to determine the process parameters or optical aberrations of a lithographic system. As shown, the scatterometry target 410 includes an array of rectangular line segments 412. This type of pattern is sometimes referred to as a checkerboard pattern. The line lengths, line widths, and spacings therebtween in the x and y directions may be widely varied. In the illustrated embodiment, the linewidth is equal to d, the line length is equal to 2d and the spacing is equal to d. In some cases, the dimension d is equal to the design rule of the feature size.

Figure 16:
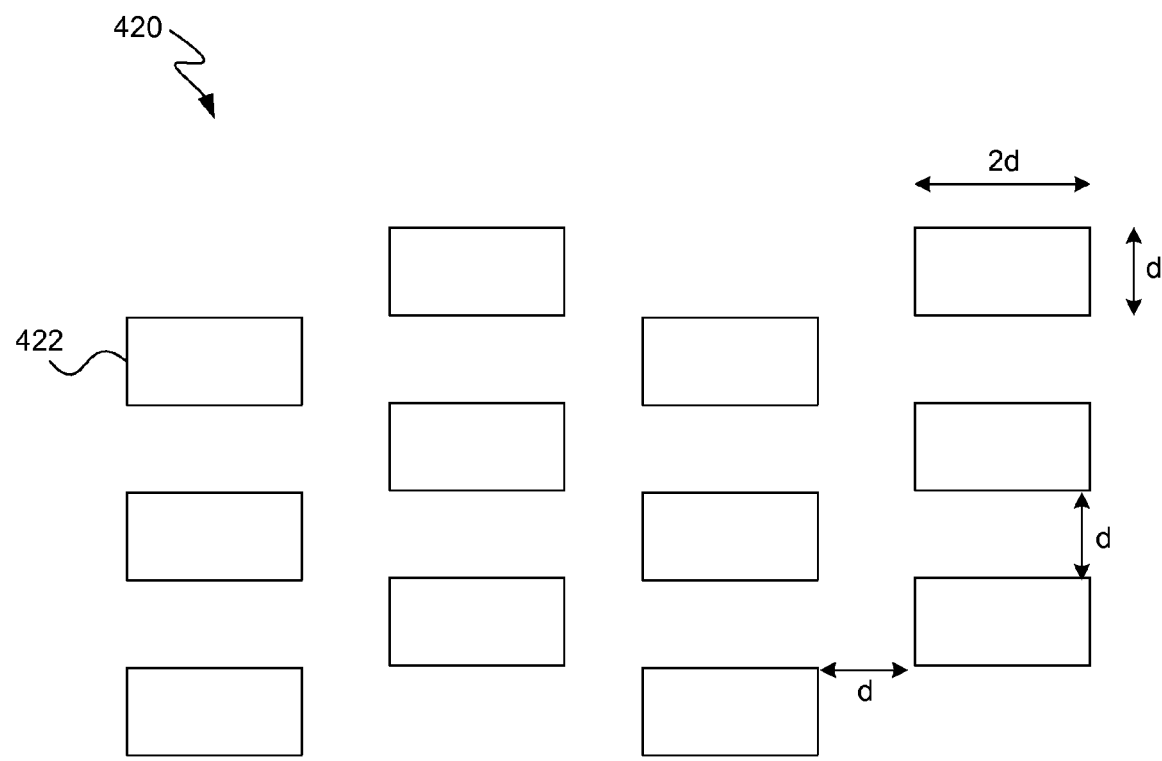
FIG. 16 is a simplified top view of a scatterometry target that may be used to determine the process parameters or optical aberrations of a lithographic system, in accordance with one embodiment of the present invention.
Figure 17:
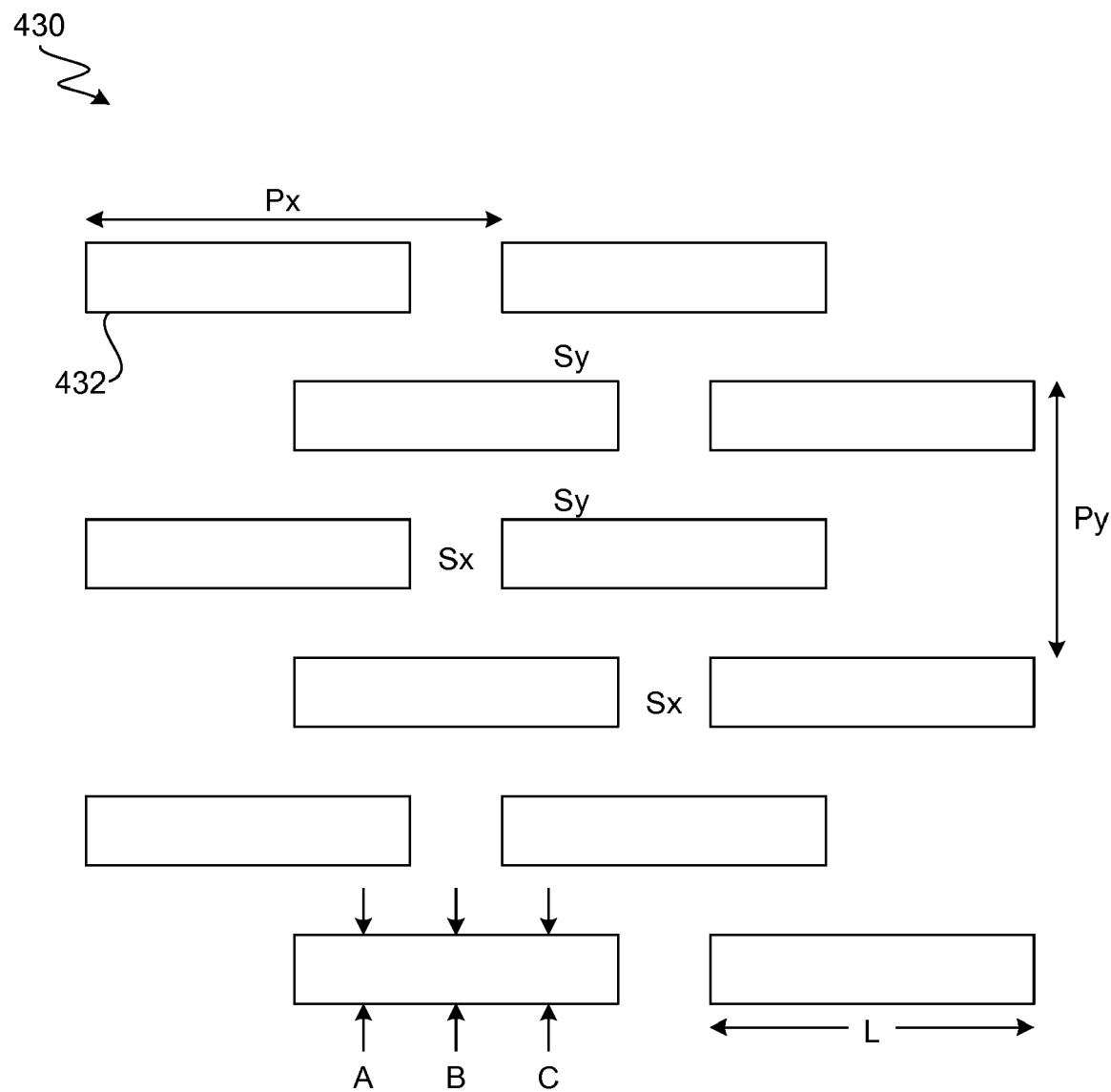
FIG. 17 is a simplified top view of a scatterometry target that may be used to determine the process parameters or optical aberrations of a lithographic system, in accordance with one embodiment of the present invention.

FIG. 16 is a simplified top view of a scatterometry target 420 that may be used to determine the process parameters or optical aberrations of a lithographic system. As shown, the scatterometry target 420 includes a staggered array of rectangular line segments 422. This type of pattern is sometimes referred to as a brickwall pattern. The line lengths, line widths, and spacings therebtween in the x and y directions may be widely varied. The amount of stagger between columns in the y direction may also be widely varied. In the illustrated embodiment, the linewidth is equal to d, the line length is equal to 2d and the spacing is equal to d. Furthermore, the amount of stagger for each adjacent row 424 is equal to d. In some cases, the dimension d is equal to the design rule of the feature size. FIG. 17 is a simplified top view of a scatterometry target 430 that may be used to determine the process parameters or optical aberrations of a lithographic system. The scatterometry target 430 in FIG. 17 is similar the target shown in FIG. 16 in that it includes a staggered array of rectangular line segments 432 (e.g., brickwall pattern). However, in this embodiment, the lines 432 are interspersed. Px and Py are the pattern pitch in the x and y directions, respectively, Sx and Sy are the line spacing in the x and y directions, L is the line segment length, and A, B and C are the widths of the line segment measured at different locations along the length of the element. The line length and spacings in x and y directions may be different than those shown in the example.

Other targets similar to those described herein may be found in the following references: J. van Schoot, et al, SPIE Optical Microlithography XIV, Vol 4346, p. 229, (2001); S. Verhaegen, et al, SPIE Optical Microlithography XIV, Vol 4346, p. 368, (2001); M. Moers, et al, SPIE Optical Microlithography XIV, Vol 4346 p. 1379, (2001), all of which are incorporated herein by reference.

It is therefore intended that the following appended claims be interpreted as including all such alterations, permutations, and equivalents as fall within the true spirit and scope of the present invention.

What is claimed is:

1. A method for determining optical aberrations of a photolithographic system, the method comprising:
   correlating values of a first set of two or more shape parameters with values of a first set of one or more process parameters to produce dependencies, the values of the first set of two or more shape parameters being determined via scatterometry measurement techniques;
   determining values of a second set of two or more shape parameters associated with multiple structures in a lithographic field via scatterometry measurement techniques;
   determining values of a second set of one or more process parameters associated with forming the multiple structures by comparing the second set of two or more shape parameters with the correlated dependencies;
   determining optical aberrations from lithographic process parameters determined for multiple scatterometry measurement sites in the lithographic field; and
   using the determined optical aberrations to determine corrections to one or more optical elements of the photolithographic system in order to optimize the photolithographic system and to minimize negative effects of the optical aberrations.

2. The method as recited in claim 1 wherein the process parameters correspond to focus, numerical aperture, illumination, or coherence.

3. The method as recited in claim 1 wherein the shape parameter information is interpreted from two or more different scatterometry measurement sites and wherein the scatterometry sites differ in shape, pitch, mask construction, position or orientation.

4. The method as recited in claim 1 wherein the determined optical aberrations are used to accept or reject a lithographic system for qualification.

5. The method as recited in claim 1 wherein the determined optical aberrations are used to determine optimum settings of the photolithographic system so as to minimize the negative effects of the optical aberrations.

6. The method as recited in claim 1 wherein the corrections to the one or more optical elements of the photolithography system include corrections to a lens configuration including lens orientation or clocking.

7. The method as recited in claim 1 wherein the corrections to the one or more optical elements of the photolithography system include corrections to a lens design.

8. The method as recited in claim 1 wherein the corrections to the one or more optical elements of the photolithography system include corrections to a lens manufacturing process.

9. The method as recited in claim 1 wherein the corrections to the one or more optical elements of the photolithography system include a mask design including feature orientation or mask feature parameters.

10. A method for determining optical aberrations of a photolithographic system, the method comprising:
    correlating values of a first set of two or more shape parameters with a first set of focus values to produce dependencies, the values of the first set of two or more shape parameters being determined via scatterometry measurement techniques;
    determining values of a second set of two or more shape parameters associated with multiple structures in a lithographic field via scatterometry measurement techniques;
    determining a second set of focus values associated with forming the multiple structures at multiple locations in the lithographic field by comparing the second set of two or more shape parameters with the correlated dependencies, the second set of focus values being used to form focal plane deviations in the lithographic field; and
    determining the optical aberrations of the photolithographic system from the focal plane deviations, wherein the determined optical aberrations are useful for correcting one or more optical elements of the photolithographic system.

11. The method as recited in claim 10 wherein the shape parameter information is interpreted from two or more different scatterometry measurement sites and wherein the scatterometry sites differ in shape, pitch, mask construction, position or orientation.

12. The method as recited in claim 11 wherein the determined optical aberrations are used to accept or reject a lithographic system for qualification.

13. The method as recited in claim 11 wherein the determined optical aberrations are used to determine optimum settings of the photolithographic system so as to minimize the negative effects of the optical aberrations.

14. The method as recited in claim 11 wherein the determined optical aberrations are used to determine corrections to a lens configuration including lens orientation or clocking in order to optimize the photolithographic system and to minimize the negative effects of the optical aberrations.

15. The method as recited in claim 11 wherein the determined optical aberrations are used to determine corrections to a lens design in order to optimize the photolithographic system and to minimize negative effects of the optical aberrations.

16. The method as recited in claim 11 wherein the determined optical aberrations are used to determine corrections to a lens manufacturing process to optimize the photolithographic system and to minimize negative effects of the optical aberrations.

17. The method as recited in claim 11 wherein the determined optical aberrations are used to determine a mask design including feature orientation or mask feature parameters so as to minimize negative effects of the optical aberrations.

18. A method for determining optical aberrations of a photolithographic system, the method comprising:
    correlating values of a first set of two or more shape parameters with focus values of the photolithographic system values of a first set of one or more process parameters to produce dependencies, the values of the first set of two or more shape parameters being determined via scatterometry measurement techniques;

determining values of a second set of two or more shape parameters associated with multiple structures in a lithographic field via scatterometry measurement techniques;

determining the focus values associated with forming the multiple structures at multiple locations in the lithographic field by comparing the second set of two or more shape parameters with the correlated dependencies; and determining and the optical aberrations from the focal plane deviations determined for multiple scatterometry measurement sites in the lithographic field, wherein the determined optical aberrations are useful for correcting one or more optical elements of the photolithographic system.

* * * * *